US010763585B2

(12) United States Patent
Anguera Pros et al.

(10) Patent No.: US 10,763,585 B2
(45) Date of Patent: Sep. 1, 2020

(54) ANTENNALESS WIRELESS DEVICE CAPABLE OF OPERATION IN MULTIPLE FREQUENCY REGIONS

(71) Applicant: Fractus Antennas, S.L., Sant Cugat del Vallès, Barcelona (ES)

(72) Inventors: Jaume Anguera Pros, Vinaros (ES); Aurora Andujar Linares, Barcelona (ES); Carles Puente Baliarda, Barcelona (ES); Josep Mumbru, Asnières-sur-Seine (FR)

(73) Assignee: Fractus Antennas, S.L., Sant Cugat del Vallès, Barcelona (ES)

( * ) Notice: Subject to any disclaimer, the term of this patent is extended or adjusted under 35 U.S.C. 154(b) by 10 days.

(21) Appl. No.: 16/275,792

(22) Filed: Feb. 14, 2019

(65) Prior Publication Data

US 2019/0252779 A1 Aug. 15, 2019

Related U.S. Application Data

(63) Continuation of application No. 15/927,497, filed on Mar. 21, 2018, now Pat. No. 10,249,952, which is a (Continued)

(30) Foreign Application Priority Data

Aug. 4, 2008 (EP) .................................... 08161722
Dec. 24, 2008 (EP) .................................... 08172925

(51) Int. Cl.
*H01Q 1/24* (2006.01)
*H01Q 1/50* (2006.01)

(Continued)

(52) U.S. Cl.
CPC ............... *H01Q 5/50* (2015.01); *H01Q 1/243* (2013.01); *H01Q 1/48* (2013.01); *H01Q 1/50* (2013.01);

(Continued)

(58) Field of Classification Search
CPC ........... H01Q 1/24; H01Q 1/243; H01Q 1/48; H01Q 1/50; H01Q 5/00; H01Q 5/335; H01Q 5/35; H01Q 5/50; H01Q 9/0407
See application file for complete search history.

(56) References Cited

U.S. PATENT DOCUMENTS 4,491,843 A 1/1985 Boubouleix
4,843,468 A 6/1989 Drewery (Continued)

FOREIGN PATENT DOCUMENTS

CN 1457533 11/2003
CN 1463477 A 12/2003

(Continued)

OTHER PUBLICATIONS

Van der Peet , H., EP00909089—Minutes from Oral Proceedings, EPO, Jan. 28, 2005.

(Continued)

*Primary Examiner* — Hoang V Nguyen
(74) *Attorney, Agent, or Firm* — Edell, Shapiro & Finnan, LLC

(57) ABSTRACT

The present invention refers to an antenna less wireless handheld or portable device comprising a communication module including a radiating system capable of transmitting and receiving electromagnetic wave signals in a first frequency region and in a second frequency region, wherein the highest frequency of the first frequency region is lower than the lowest frequency of the second frequency region. The radiating system comprising a radiating structure and at least (Continued)

one internal port, wherein the input impedance of the radiating structure at the/each internal port when disconnected from the radiofrequency system has an imaginary part not equal to zero for any frequency of the first frequency region; and wherein said radiofrequency system modifies the impedance of the radiating structure, providing impedance matching to the radiating system in the at least two frequency regions of operation of the radiating system.

17 Claims, 17 Drawing Sheets

Related U.S. Application Data continuation of application No. 15/131,920, filed on Apr. 18, 2016, now Pat. No. 9,960,490, which is a continuation of application No. 14/257,511, filed on Apr. 21, 2014, now Pat. No. 9,350,070, which is a continuation of application No. 13/530,704, filed on Jun. 22, 2012, now Pat. No. 8,736,497, which is a continuation of application No. 12/669,928, filed as application No. PCT/EP2009/005578 on Jul. 31, 2009, now Pat. No. 8,237,615.

(60) Provisional application No. 61/142,523, filed on Jan. 5, 2009, provisional application No. 61/086,838, filed on Aug. 7, 2008.

(51) Int. Cl.

| | |
|---|---|
| ***H01Q 5/50*** | (2015.01) |
| ***H01Q 5/00*** | (2015.01) |
| ***H01Q 5/35*** | (2015.01) |
| ***H01Q 5/335*** | (2015.01) |
| ***H01Q 9/04*** | (2006.01) |
| ***H01Q 1/48*** | (2006.01) |

(52) U.S. Cl.

CPC ............... *H01Q 5/00* (2013.01); *H01Q 5/335* (2015.01); *H01Q 5/35* (2015.01); *H01Q 9/0407* (2013.01); *H05K 999/99* (2013.01)

(56) References Cited

U.S. PATENT DOCUMENTS

| | | | | |
|---|---|---|---|---|
| 5,363,114 | A | 11/1994 | Shoemaker | |
| 5,489,912 | A | 2/1996 | Holloway | |
| 5,657,386 | A | 8/1997 | Schwanke | |
| 5,666,125 | A | 9/1997 | Luxon | |
| 5,784,032 | A | 7/1998 | Johnston | |
| 5,826,201 | A | 10/1998 | Gratias | |
| 5,903,822 | A | 5/1999 | Sekine | |
| 6,011,518 | A | 1/2000 | Yamagishi | |
| 6,087,990 | A | 7/2000 | Thill | |
| 6,133,883 | A | 10/2000 | Munson | |
| 6,184,844 | B1 | 2/2001 | Filipovic et al. | |
| 6,211,826 | B1 | 4/2001 | Aoki | |
| 6,218,989 | B1 | 4/2001 | Schneider | |
| 6,218,992 | B1 | 4/2001 | Sadler | |
| 6,373,439 | B1 | 4/2002 | Zürcher | |
| 6,388,631 | B1 | 5/2002 | Livingston | |
| 6,674,411 | B2 | 1/2004 | Boyle | |
| 6,762,723 | B2 | 7/2004 | Di Nallo | |
| 6,791,498 | B2 | 9/2004 | Boyle | |
| 6,795,027 | B2 | 9/2004 | Boyle | |
| 6,873,299 | B2 | 3/2005 | Dakeya | |
| 7,069,043 | B2 | 6/2006 | Sawamura | |
| 7,081,854 | B2 | 7/2006 | Ying et al. | |
| 7,176,845 | B2 | 2/2007 | Fabrega-Sanchez | |
| 7,209,087 | B2 | 4/2007 | Tang et al. | |
| 7,215,284 | B2 | 5/2007 | Collinson | |
| 7,274,340 | B2 | 9/2007 | Ozden | |
| 7,345,634 | B2 | 3/2008 | Ozkar et al. | |
| 7,511,675 | B2 | 3/2009 | Puente | |
| 7,683,839 | B2 | 3/2010 | Ollikainen et al. | |
| 7,688,276 | B2 | 3/2010 | Quintero | |
| 7,760,146 | B2 | 7/2010 | Ollikainen | |
| 7,764,232 | B2 * | 7/2010 | Achour ................ | H01Q 21/065 343/700 MS |
| 7,768,462 | B2 * | 8/2010 | Zhang .................... | H01Q 1/243 343/702 |
| 7,876,274 | B2 * | 1/2011 | Hobson .................... | H01Q 1/48 343/702 |
| 8,203,492 | B2 | 6/2012 | Anguera et al. | |
| 2002/0149524 | A1 | 10/2002 | Boyle | |
| 2003/0063036 | A1 | 4/2003 | Sato et al. | |
| 2003/0068998 | A1 | 4/2003 | Yamakawa et al. | |
| 2003/0174092 | A1 | 9/2003 | Sullivan | |
| 2004/0058723 | A1 | 3/2004 | Mikkola | |
| 2004/0145527 | A1 | 7/2004 | Mikkola | |
| 2006/0214856 | A1 | 9/2006 | Nakano et al. | |
| 2006/0214857 | A1 | 9/2006 | Ollikainen | |
| 2007/0109196 | A1 | 5/2007 | Tang | |
| 2007/0109208 | A1 | 5/2007 | Turner | |
| 2007/0146212 | A1 | 6/2007 | Ozden | |
| 2007/0152885 | A1 | 7/2007 | Sorvala | |
| 2007/0152886 | A1 | 7/2007 | Puente | |
| 2007/0171131 | A1 | 7/2007 | Sorvala | |
| 2007/0194995 | A1 | 8/2007 | Fang et al. | |
| 2007/0210899 | A1 | 9/2007 | Kato et al. | |
| 2008/0018543 | A1 | 1/2008 | Puente | |
| 2008/0030410 | A1 | 2/2008 | Ying | |
| 2008/0042909 | A1 | 2/2008 | Puente | |
| 2008/0100514 | A1 | 5/2008 | Abdul-Gaffoor | |
| 2009/0005110 | A1 | 1/2009 | Ozden | |
| 2009/0309797 | A1 | 12/2009 | Ozden | |
| 2009/0322619 | A1 | 12/2009 | Ollikainen et al. | |
| 2009/0322623 | A1 | 12/2009 | Xie et al. | |
| 2010/0073253 | A1 | 3/2010 | Ollikainen | |
| 2011/0117976 | A1 | 5/2011 | Nishikido et al. | |
| 2012/0288762 | A1 | 11/2012 | Hardin | |
| 2013/0004658 | A1 | 1/2013 | Yang | |

FOREIGN PATENT DOCUMENTS

| | | | |
|---|---|---|---|
| CN | 1649206 | | 8/2005 |
| CN | 1922762 | A | 2/2007 |
| CN | 201069869 | | 6/2008 |
| DE | 2362240 | | 7/1974 |
| EP | 0969375 | | 1/2000 |
| EP | 1093098 | | 4/2001 |
| EP | 1258054 | | 11/2002 |
| EP | 1662604 | | 5/2006 |
| ES | 2112163 | | 3/1998 |
| FR | 2211766 | | 7/1974 |
| GB | 2344969 | | 6/2000 |
| JP | 2002223114 | | 8/2002 |
| JP | 2006279159 | | 10/2006 |
| KR | 10-0695813 | | 3/2007 |
| KR | 10-2008-0080409 | | 9/2008 |
| KR | 20090016494 | | 2/2009 |
| WO | 94/26000 | | 11/1994 |
| WO | 97/06578 | | 2/1997 |
| WO | 97/47054 | | 12/1997 |
| WO | 99/27608 | | 6/1999 |
| WO | 00/76023 | | 12/2000 |
| WO | 01/54225 | | 7/2001 |
| WO | 02/13306 | | 2/2002 |
| WO | 02/063712 | | 8/2002 |
| WO | 02/071541 | | 9/2002 |
| WO | 2006/020285 | | 2/2006 |
| WO | 2006/097496 | | 9/2006 |
| WO | 2007/039071 | | 4/2007 |
| WO | 2007/039668 | | 4/2007 |
| WO | 2007/128340 | | 11/2007 |
| WO | 2007/141187 | | 12/2007 |
| WO | 2008/009391 | | 1/2008 |
| WO | 2008/045151 | | 4/2008 |
| WO | 2008/119699 | | 10/2008 |

(56) References Cited

FOREIGN PATENT DOCUMENTS

| | | |
|---|---|---|
| WO | 2010/010529 | 1/2010 |
| WO | 2012/100178 | 7/2012 |

OTHER PUBLICATIONS

Wimer , M. C., U.S. Appl. No. 10/422,578—Office action dated Mar. 26, 2008, USPTO, Mar. 26, 2008.
Wimer , M. C., U.S. Appl. No. 10/422,578—Office Action dated Aug. 23, 2007, USPTO, Aug. 23, 2007.
Wimer , M. C., U.S. Appl. No. 10/422,578—Office Action dated Mar. 12, 2007, USPTO, Mar. 12, 2007.
Wimer , M. C., U.S. Appl. No. 10/422,578—Office Action dated Jan. 26, 2006, USPTO, Jan. 26, 2006.
Wimer , M. C., U.S. Appl. No. 10/422,578—Office Action dated Aug. 24, 2005, USPTO, Aug. 24, 2005.
Weman , E., EP00909089—Summons to attend oral proceedings, EPO, Oct. 28, 2004.
Wimer , M. C., U.S. Appl. No. 10/422,578—Office Action dated Apr. 7, 2005, USPTO, Apr. 7, 2005.
Wimer , M. C., U.S. Appl. No. 10/422,578—Office Action dated Oct. 4, 2004, USPTO, Oct. 4, 2004.
Nguyen , H. V., U.S. Appl. No. 12/669,928—Notice of allowance dated Apr. 12, 2012, USPTO, Apr. 12, 2012.
Wittmann-Regis , A., PCT/EP2009/005578—International Search Report and Written Opinion of the International Searching Authority, WIPO, dated Feb. 17, 2011.
Weman , E., PCT/EP2009/005579—International Search Report and Written Opinion of the International Searching Authority, EPO, dated May 4, 2010.
Louhos, J. P. and Pankinaho, I., "Electrical Tuning of Integrated Mobile Phone Antennas", Proceedings of the 1999 Antenna Applications Symposium, 1999, pp. 69-96, vol. I, University of Massatchusetts.
Vainikainen, P. et al., "Resonator-Based Analysis of the Combination of Mobile Handset Antenna and Chassis", IEEE Transactions on Antennas and Propagation, 2002, pp. 1433-1444, vol. 50(10).
Addison , P. S., Fractals and Chaos—An illustrated course—Full, Institute of Physics Publishing Bristol and Philadelphia, Jan. 1, 1997.
Aguilar , D. ; Anguera , J. ; Puente , C. ; Ribo , M., Small handset antenna for FM reception, Microwave and Optical Technology Letters, Oct. 1, 2008.
Anguera , J. ; Sanz , I. ; Sanz , A. et al, Enhancing the performance of handset antennas by means of groundplane design , IEEE Transactions on antennas and propagation , 2006.
Balanis , C. A., Antenna Theory—Analysis and design—Chapter 4—Linear wire antennas, Hamilton Printing, Jan. 1, 1982, p. 133-194.
Bank , M. ; Levin , B., The development of a cellular phone antenna with small irradiation of human-organism tissues, Antennas and Propagation Magazine, IEEE, Jan. 1, 2007, vol. 49, No. 4.
Bedair , A. ; Abdel-Mooty Abdel-Rahman , A. B., Design and development of high gain wideband microstrip antenna and DGS filters using numerical experimentation approach, Universitat Magdeburg. Fakultat Elektrotechnik und Informationstechnik der Otto-von-Guericke-, Jun. 1, 2005.
Behdad , N. et al., Slot antenna design for wireless communications systems, Antennas and Propagation (EUCAP), 2nd , 2007. European Conference on, Nov. 8, 2007.
Berizzi , F., Fractal analysis of the signal scattered from the sea surface, Antennas and Propagation, IEEE Transactions on, Feb. 1, 1999, vol. 47, No. 2.
Bialkowski , M. et al., An equivalent circuit model of a radial line planar antenna with coupling probes, Antennas and Propagation Society (APS), 2002. IEEE International Symposium, Jun. 16, 2002.
Boshoff , H., A fast box counting algorithm for determining the fractal dimension of sampled continuous functions, IEEE, Jan. 1, 1992.
Byndas , A. et al., Investigations into operation of single- and multi-layer configurations of planar inverted-F antenna, Antennas and Propagation Magazine, IEEE, Aug. 1, 2007, vol. 49, No. 4.
Cabedo Fabres , M., Modal analysis of a radiating slotted PCB for mobile handsets, Antennas and Propagation (EUCAP), 1st , Nice, 2006. European Conference on, Nov. 6, 2006.
Cabedo Fabres , M., Systematic design of antennas using the theory of characteristic modes, Universitat Politecnica de Valencia, Feb. 1, 2007.
Cabedo Fabres , M. et al., The theory of characteristics modes revisited: a contribution to the design of antennas for modern applications, Antennas and Propagation Magazine, IEEE, Oct. 1, 2007, vol. 49, No. 5.
Cabedo Fabres , M. et al., Wideband radiating ground plane with notches, Antennas and Propagation Society (APS), 2005. IEEE International Symposium, Jul. 3, 2005.
Carver , K. R. et al., Microstrip antenna technology, Antennas and Propagation, IEEE Transactions on, Jan. 1, 1981, vol. AP29, No. 1.
Chaudhury, S. K. ; Schoeder , W. ; Chaloupka , H., Multiple antenna concept based on characteristic modes of mobiles phone chassis, Antennas and Propagation (EUCAP), 2nd , 2007. European Conference on, 2007.
Chen , S. et al., On the calculation of Fractal features from images, Pattern Analysis and Machine Intelligence, IEEE Transactions on, Oct. 1, 1993, vol. 15, No. 10.
Collins , B. S., Improving the RF performance of clamshell handsets, Antenna Technology : Small Antennas and Novel Metamaterials (IWAT), 2006. IEEE International Workshop on, Mar. 6, 2006.
Falconer , K., Fractal geometry _Full, John Wiley Sons—2nd ed., Jan. 1, 2003.
Fang , S. ; Shieh , M., Compact monopole antenna for GSM7DCS/PCS mobile phone, IEEE, Jan. 1, 2005.
Feng , J., Fractional box-counting approach to fractal dimension estimation, Pattern Recognition, 13th , 1996. International Conference on, Jan. 1, 1996.
Garg , R. et al., Microstrip antenna design handbook, Artech House, Jan. 1, 2001, p. 845.
Hall , P. S. ; Gardner , P. et al., Reconfigurable antenna challenges for future radio systems, Antennas and Propagation (EUCAP), 3rd , 2009. European Conference on, Mar. 23, 2009.
Hansen , R. C., Fundamental limitations in antennas, Proceedings of the IEEE, Feb. 1, 1981, vol. 69, No. 2, p. 170-182.
Hirose , K. ; Obuse , K. ; Uchikawa , Y. et al, Low-profile circularly polarized radiation elements loops with balanced and unbalanced feeds, Antennas and Propagation Society (APS), 2008. IEEE International Symposium, Jul. 5, 2008.
Hong , W. et al, Low-profile, multi-element, miniaturized monopole antenna, Antennas and Propagation, IEEE Transactions on, 2009.
Hsu , M. R. ; Wong , K., Ceramic chio antenna for WWAN Operation, Microwave Conference (APMC), 2008. Asia-Pacific, Dec. 16, 2008.
Huynh , M. C., A numerical and experimental investigation of planar inverted-F antennas for wireless communication applications, Virginia Polytechnic Institute and State University, Oct. 19, 2000.
Ilvonen , J., Isolated antenna structures of mobile terminals, Helsinki University of Technology, Aug. 16, 2009, p. 98.
Jung , C. ; Lee , M., Reconfigurable Scan-Beam Single-Arm Spiral Antenna Integrated With RF-MEMS Switches, Antennas and Propagation, IEEE Transactions on, Feb. 1, 2006, vol. 54, No. 2.
Kabacik , P., Potential advantage of using non rectangular ground in small antennas featuring wideband impedance match, Antennas and Propagation Society (APS), 2007. IEEE International Symposium, May 1, 2007.
Kabacik , P. et al., Broadening the range of resonance tuning in multiband small antennas, Wireless Communication Technology, 2003. IEEE Topical Conference on, Oct. 15, 2003.

(56) References Cited

OTHER PUBLICATIONS

Kabacik , P. et al., An application of a narrow slot cut in the ground to improve multi-band operation of a small antenna, Antennas and Propagation Society (APS), 2007. IEEE International Symposium, Jun. 10, 2007.
Kabacik , P. et al., Broadening the bandwidth in terminal antennas by tuning the coupling between the element and its ground, Antennas and Propagation Society (APS), 2005. IEEE International Symposium, Jul. 3, 2005, vol. 3.
Kildal , P. S. ; Luxey , C. ; Skrivervik , A. K. et al, Report on the state of the art in small terminal antennas: Technologies, requirements and standards, ACE (Antenna Centre of Excellence), Dec. 31, 2004, p. 120.
Kim , Y. ; Lee , S., Design and fabrication of a planar inverted-f antenna for the wireless lan in teh 5 GHz band, Microwave and Optical Technology Letters, Sep. 20, 2002, vol. 34, No. 6, p. 469-475.
Kivekas , O. et al., Design of high-efficiency antennas for mobile communications devices, Helsinki University of Technology, Aug. 1, 2005.
Kobayashi , K., Estimation of 3D fractal dimension of real electrical tree patterns, Properties and Applications of Dielectric Materials, 4th , 1994. International Conference on, Jul. 1, 1994.
Kraus , J. D., Antennas, McGraw-Hill Book Company, Jan. 1, 1988, Pag.Contents.
Kyro , M. ; Mustonen , M. et al., Dual-element antenna for DVB-H terminal, Loughborough (LAPC), 2008. Antennas and Propagation Conference, Mar. 17, 2008.
Lin , C. I. et al., Printed monopole slot antenna for multiband operation in the mobile phone, Antennas and Propagation Society (APS), 2006. IEEE International Symposium, May 1, 2006.
Lindberg , P. et al., Wideband active and passive antenna solutions for handheld terminals, Uppsala Universitet. Acta Universitatis Upsaliensis, Jan. 1, 2007.
Martinez-Vazquez , M., A Review of ACE small terminal antennas activities, ACE (Antenna Centre of Excellence), Nov. 10, 2004.
Meinke , H., Taschenbuch der hochfrequenztechnik—XP002560328, Springer, Jan. 1, 1992, p. N 14.
Meinke , H., Taschenbuch der hochfrequenztechnik—XP002462630, Springer, Jan. 1, 1992.
Meinke , H. ; Gundlach , F., Taschenbuch der Hochfrequenztechnik: Paperback of high frequency engineering with the collaboration of several experts, Springer, Jan. 1, 1968.
Meinke , H. et al., Taschenbuch der hochfrequenztechnik—Handbook of high frequency technique, Springer, Jan. 1, 1968.
Mi , M. et al., RF Energy harvesting with multiple antennas in the same space, Antennas and Propagation Magazine, IEEE, Oct. 1, 2005, vol. 47, No. 5.
Minard , P. ; Pintos , J. ; Louzir , A. et al, On-Board integration of compact printed WiFi antennas with existing DECT Antenna System, Antennas and Propagation Society (APS), 2008. IEEE International Symposium, Jul. 5, 2008.
Morishita , H. et al, Design concept of antennas for small mobile terminals and the future perspective, Antennas and Propagation Magazine, IEEE, Oct. 1, 2002.
Munson , R., Antenna engineering Handbook—Chapter 7—Microstrip Antennas, Johnson , R. C.—McGraw-Hill—Third Edition, Jan. 1, 1993.
NA, Software—Box counting dimension [electronic], Sewanee—http://www.sewanee.edu/Physics/PHYSICS123/BOX%20COUNTING%20DIMENSION.html, Apr. 1, 2002.
Neary , D., Fractal methods in image analysis and coding, Dublin City University—www.redbrick.dcu.ie/*bolsh/thesis/node16.html and *node22.html, Jan. 22, 2001.
Ng , V., Diagnosis of melanoma with fractal dimesions, TENCON, 1993. IEEE Conference, Jan. 1, 1993.
Ollikainen , J. et al., Design and implementation techniques of wideband mobile communications antennas, Helsinki University of Technology, Nov. 1, 2004.
Park , J. ; Lee , Y. ; Kim , Y. et al, Performance improvement methodology of isolation in a Dual-standby mobile phone by optimizing antenna topology and position, Antennas and Propagation Society (APS), 2008. IEEE International Symposium, Jul. 5, 2008.
Peitgen , H. O. ; Jürgens , H. ; Saupe , D., Chaos and fractals. New frontiers of science, Springer, Feb. 12, 1993, p. 212-216 ; 387-388.
Penn , A., Fractal dimension of low-resolution medical images, Engineering in Medicine and Biology Society (EMBS), 18th ,1996. IEEE Annual International Conference of the, Jan. 1, 1996.
Poutanen , J., Interaction between mobile terminal antenna and user, Helsinki University of Technology, Sep. 10, 2007.
Poutanen , J. ; Villanen , J. ; Icheln , C. et al, Behaviour of mobile terminal antennas near heman tissue at a wide frequency range, Antenna Technology : Small Antennas and Novel Metamaterials (IWAT), 2008. IEEE International Workshop on, Jan. 1, 2008.
Pozar , D. M. ; Schaubert , D. H., Microstrip antennas. The analysis and design of microstrip antennas and arrays, IEEE Press; Pozar, Schaubert, Jan. 1, 1995, p. 431.
Rahola , J. ; Ollikainen , J., Optimal antenna placement for mobile terminals using characteristic mode analysis, Antennas and Propagation (EUCAP), 1st , Nice, 2006. European Conference on, Nov. 1, 2006.
Rouvier , R. et al., Fractal analysis of bidimensional profiles and application to electromagnetic scattering from soils, IEEE, Jan. 1, 1996.
Russell , D. A. et al., Dimension of strange attractors, Physical Review, Oct. 6, 1980, vol. 45, No. 14.
Sarkar , N., An efficient differential box-counting approach to compute fractal dimension of image, Systems, Man and Cybernetics, 1994. IEEE International Conference on, Jan. 3, 1994, vol. 24, No. 1.
Schroeder , W. L., Miniaturization of mobile phone antennas by utilization of chassis mode resonances, Microwave Conference (EuMC), 36th , 2006. European, Sep. 1, 2006.
Serrano , R. et al., Active balanced feeding for compact wideband antennas, Antennas and Propagation Society (APS), 2007. IEEE International Symposium, Jun. 10, 2007.
Skrivervik , A. K. et al, PCS antenna design—The challenge of miniaturization, Antennas and Propagation Magazine, IEEE, Aug. 1, 2001.
So , P. et al, Box-counting dimension without boxes—Computing D0 from average expansion rates, Physical Review, Jul. 1, 1999, vol. 60, No. 1.
Su , C., EMC internal patch antenna for UMTS operation in a mobile device, Antennas and Propagation, IEEE Transactions on, Nov. 1, 2005, vol. 53, No. 11.
Su , C. M. et al., User's hand effects on EMC internal GSM/DCS mobile phone antenna, Antennas and Propagation Society (APS), 2006. IEEE International Symposium, Jan. 2, 2006.
Talmola , P., Finding the right frequency: impact of spectrum availability upon the economics of mobile broadcasting, RF for DVB-H/DMB Mobile Broadcast , IET Seminar on, Jun. 30, 2006.
Tang , Y., The application of fractal analysis to feature extraction, IEEE, Jan. 1, 1999.
Vainikainen , P ; Mustonen , M ; Kyrö , M. et al, Recent development of MIMO antennas and their evaluation for small mobile terminals, Microwave Radar and Wireless Communications (MIKON), 17th , 2008. International Conference on, May 19, 2008.
Vainikainen , P., Design and measurements of small antennas for mobile terminals—Part II, Helsinki University of Technology, Jun. 22, 2006.
Vainikainen , P., Design and measurements of small antennas for mobile terminals, Helsinki University of Technology, Jun. 20, 2006.
Villanen , J., Compact antenna structures for mobile handsets, Vehicular Technology (VTC), 58th , 2003. IEEE Conference, Oct. 6, 2003.
Villanen , J., Coupling element based mobile terminal antenna structures, Antennas and Propagation, IEEE Transactions on, Jul. 1, 2006.
Villanen , J., Miniaturization and evaluation methods of mobile terminal antenna structures, Helsinki University of Technology. Radio Laboratory Publications, Sep. 3, 2007.

(56) References Cited

OTHER PUBLICATIONS

Villanen , J. ; Suvikunnas , P. ; Icheln , C. et al, Performance analysis and design aspects of mobile-terminal multiantenna configurations, Vehicular Technology (VTC), 67th , 2008. IEEE Conference, May 1, 2008, vol. 57, No. 3.
Villanen , J.; Icheln , C. ; Vainikainen , P., A coupling element-based quad-band antenna structure for mobile terminals , Microwave and optical technology letters , vol. 49, No. 6, Jun. 2007.
Villanen, J.; Vainikainen, P., Optimum dual-resonant impedance matching of coupling element based mobile terminal antenna structures, Microwave and optical technology letters, vol. 49, No. 10, Oct. 2007.
Villanen , J.; Ollikainen , J. ; Kivekas , O. et al , Coupling element based mobile terminal antenna structures , IEEE Transactions on antennas and propagation , vol. 45 , No. 7 , Jul. 2006.
Wong , K. ; Huang , C., Printed Loop Antenna with a Perpendicular Feed for Penta-Band Mobile Phone Application, Antennas and Propagation, IEEE Transactions on, Jul. 1, 2008, vol. 56, No. 7.
Wong , K. L., Planar antennas for wireless communications_Full, Wiley Interscience, Jan. 1, 2003.
Wong , K. L., Surface-mountable EMC monopole chip antenna for WLAN operation, Antennas and Propagation, IEEE Transactions on, Apr. 1, 2006, vol. 54, No. 4.
Wong , K. L., Internal shorted patch antenna for UMTS folder-type mobile phone, Antennas and Propagation, IEEE Transactions on, Oct. 1, 2005, vol. 53, No. 10.
Wong , K. L., Internal GSM/DCS antenna backed by a step-shaped ground plane for a PDA phone, Antennas and Propagation, IEEE Transactions on, Aug. 1, 2006, vol. 54, No. 8.
Wong , K. L. ; Su , W. C. ; Chang , F. S., Wideband internal folded planar monopole antenna for UMTS/WiMax folder-type mobile phone, Microwave and Optical Technology Letters, Feb. 2, 2006, vol. 48.
Wong , K. L. ; Tu , S. Y., Ultra-wideband loop antenna coupled-fed by a monopole feed for penta-band folder-type mobile phone, Microwave and Optical Technology Letters, Oct. 10, 2008, vol. 50.
Jaggard , D. L., Expert report of Dwight L. Jaggard (redacted)—expert witness retained by Fractus, Fractus, Feb. 23, 2011.
Jaggard , D. L., Rebuttal expert report of Dr. Dwight L. Jaggard (redacted version), Fractus, Feb. 16, 2011.
Long , S., Rebuttal expert report of Dr. Stuart A. Long (redacted version), Fractus, Feb. 16, 2011.
NA, Letter from Baker Botts to Kenyon & Kenyon LLP, Winstead PC and Howison & Arnott LLP including exhibits., Defendants—Baker Botts, Oct. 28, 2009.
NA, Document 0190—Defendant HTC Corporation's First amended answer and counterclaim to plaintiff's amended complaint, Defendants, Oct. 2, 2009.
Felgel-Farnholz , W. D., EP00909089—Office Action dated Feb. 7, 2003, EPO, Feb. 7, 2003.
Felgel-Farnholz , W. D., PCT/EP00/00411—International preliminary examination report dated Aug. 29, 2002—Notification concerning documents transmitted, EPO, Aug. 29, 2002.
Carpintero , F., EP00909089—Written submissions, Herrero & Asociados, Dec. 15, 2004.
Carpintero , F., EP00909089—Response to Office Action dated Feb. 7, 2003, Herrero & Asociados, Aug. 14, 2003.

* cited by examiner

ANTENNALESS WIRELESS DEVICE CAPABLE OF OPERATION IN MULTIPLE FREQUENCY REGIONS

CROSS REFERENCE TO RELATED APPLICATIONS

This application is a continuation of U.S. patent application Ser. No. 15/927,497, filed on Mar. 21, 2018, which is a continuation of U.S. patent application Ser. No. 15/131,920, filed on Apr. 18, 2016, now U.S. Pat. No. 9,960,490, issued on May 1, 2018, which is a continuation of U.S. patent application Ser. No. 14/257,511, filed on Apr. 21, 2014, now U.S. Pat. No. 9,350,070, issued on May 24, 2016, which is a continuation of U.S. patent application Ser. No. 13/530,704 filed Jun. 22, 2012, now U.S. Pat. No. 8,736,497, issued on May 27, 2014, which is a continuation of U.S. patent application Ser. No. 12/669,928, filed on Feb. 22, 2010, now U.S. Pat. No. 8,327,615, issued on Aug. 7, 2012, which is a National Stage Entry of PCT/EP2009/005578, filed on Jul. 31, 2009. In addition, U.S. patent application Ser. No. 12/669,928 claims priority from U.S. Provisional Application No. 61/086,838, filed on Aug. 7, 2008 and 61/142,523, filed on Jan. 5, 2009. The entire contents of each of the aforementioned applications are hereby incorporated by reference.

FIELD OF THE INVENTION

The present invention relates to the field of wireless handheld devices, and generally to wireless portable devices which require the transmission and reception of electromagnetic wave signals.

BACKGROUND

Wireless handheld or portable devices typically operate one or more cellular communication standards and/or wireless connectivity standards, each standard being allocated in one or more frequency bands, and said frequency bands being contained within one or more regions of the electromagnetic spectrum.

For that purpose, a space within the wireless handheld or portable device is usually dedicated to the integration of a radiating system. The radiating system is, however, expected to be small in order to occupy as little space as possible within the device, which then allows for smaller devices, or for the addition of more specific equipment and functionality into the device. At the same time, it is sometimes required for the radiating system to be flat since this allows for slim devices or in particular, for devices which have two parts that can be shifted or twisted against each other.

Many of the demands for wireless handheld or portable devices also translate to specific demands for the radiating systems thereof.

A typical wireless handheld device must include a radiating system capable of operating in one ore more frequency regions with good radioelectric performance (such as for example in terms of input impedance level, impedance bandwidth, gain, efficiency, or radiation pattern). Moreover, the integration of the radiating system within the wireless handheld device must be correct to ensure that the wireless device itself attains a good radioelectric performance (such as for example in terms of radiated power, received power, or sensitivity).

This is even more critical in the case in which the wireless handheld device is a multifunctional wireless device. Commonly-owned patent applications WO2008/009391 and US2008/0018543 describe a multifunctional wireless device. The entire disclosure of said application numbers WO2008/009391 and US2008/0018543 are hereby incorporated by reference.

For a good wireless connection, high gain and efficiency are further required. Other more common design demands for radiating systems are the voltage standing wave ratio (VSWR) and the impedance which is supposed to be about 50 ohms.

Other demands for radiating systems for wireless handheld or portable devices are low cost and a low specific absorption rate (SAR).

Furthermore, a radiating system has to be integrated into a device or in other words a wireless handheld or portable device has to be constructed such that an appropriate radiating system may be integrated therein which puts additional constraints by consideration of the mechanical fit, the electrical fit and the assembly fit.

Of further importance, usually, is the robustness of the radiating system which means that the radiating system does not change its properties upon smaller shocks to the device.

A radiating system for a wireless device typically includes a radiating structure comprising an antenna element which operates in combination with a ground plane layer providing a determined radioelectric performance in one or more frequency regions of the electromagnetic spectrum. This is illustrated in FIG. 17, in which it is shown a conventional radiating structure 1700 comprising an antenna element 1701 and a ground plane layer 1702. Typically, the antenna element has a dimension close to an integer multiple of a quarter of the wavelength at a frequency of operation of the radiating structure, so that the antenna element is at resonance at said frequency and a radiation mode is excited on said antenna element.

Although the radiating structure is usually very efficient at the resonance frequency of the antenna element and maintains a similar performance within a frequency range defined around said resonance frequency (or resonance frequencies), outside said frequency range the efficiency and other relevant antenna parameters deteriorate with an increasing distance to said resonance frequency.

Furthermore, the radiating structure operating at a resonance frequency of the antenna element is typically very sensitive to external effects (such as for instance the presence of plastic or dielectric covers that surround the wireless device), to components of the wireless device (such as for instance, but not limited to, a speaker, a microphone, a connector, a display, a shield can, a vibrating module, a battery, or an electronic module or subsystem) placed either in the vicinity of, or even underneath, the antenna element, and/or to the presence of the user of the wireless device.

Any of the above mentioned aspects may alter the current distribution and/or the electromagnetic field distribution of a radiation mode of the antenna element, which usually translates into detuning effects, degradation of the radioelectric performance of the radiating structure and/or the radioelectric performance wireless device, and/or greater interaction with the user (such as an increased level of SAR).

A further problem associated to the integration of the radiating structure, and in particular to the integration of the antenna element, in a wireless device is that the volume dedicated for such an integration has continuously shrunk with the appearance of new smaller and/or thinner form factors for wireless devices, and with the increasing convergence of different functionality in a same wireless device.

Some techniques to miniaturize and/or optimize the multiband behavior of an antenna element have been described in the prior art. However, the radiating structures therein described still rely on exciting a radiation mode on the antenna element.

For example, commonly-owned co-pending patent application US2007/0152886 describes a new family of antennas based on the geometry of space-filling curves.

Also, commonly-owned co-pending patent application US2008/0042909 relates to a new family of antennas, referred to as multilevel antennas, formed by an electromagnetic grouping of similar geometrical elements. The entire disclosures of the aforesaid application numbers US2007/0152886 and US2008/0042909 are hereby incorporated by reference.

Some other attempts have focused on antenna elements not requiring a complex geometry while still providing some degree of miniaturization by using an antenna element that is not resonant in the one or more frequency ranges of operation of the wireless device.

For example, WO2007/128340 discloses a wireless portable device comprising a non-resonant antenna element for receiving broadcast signals (such as, for instance, DVB-H, DMB, T-DMB or FM). The wireless portable device further comprises a ground plane layer that is used in combination with said antenna element. Although the antenna element has a first resonance frequency above the frequency range of operation of the wireless device, the antenna element is still the main responsible for the radiation process and for the electromagnetic performance of the wireless device. This is clear from the fact that no radiation mode can be excited on the ground plane layer because the ground plane layer is electrically short at the frequencies of operation (i.e., its dimensions are much smaller than the wavelength).

With such limitations, while the performance of the wireless portable device may be sufficient for reception of electromagnetic wave signals (such as those of a broadcast service), the antenna element could not provide an adequate performance (for example, in terms of input return losses or gain) for a cellular communication standard requiring also the transmission of electromagnetic wave signals.

Commonly-owned patent application WO2008/119699 describes a wireless handheld or portable device comprising a radiating system capable of operating in two frequency regions. The radiating system comprises an antenna element having a resonance frequency outside said two frequency regions, and a ground plane layer. In this wireless device, while the ground plane layer contributes to enhance the electromagnetic performance of the radiating system in the two frequency regions of operation, it is still necessary to excite a radiation mode on the antenna element. In fact, the radiating system relies on the relationship between a resonance frequency of the antenna element and a resonance frequency of the ground plane layer in order for the radiating system to operate properly in said two frequency regions.

The entire disclosure of the aforesaid application number WO2008/119699 is hereby incorporated by reference.

Some further techniques to enhance the behavior of an antenna element relate to optimizing the geometry of a ground plane layer associated to said antenna element. For example, commonly-owned co-pending patent application U.S. Ser. No. 12/033,446 describes a new family of ground plane layers based on the geometry of multilevel structures and/or space-filling curves. The entire disclosure of the aforesaid application number U.S. Ser. No. 12/033,446 is hereby incorporated by reference.

Another limitation of current wireless handheld or portable devices relates to the fact that the design and integration of an antenna element for a radiating structure in a wireless device is typically customized for each device. Different form factors or platforms, or a different distribution of the functional blocks of the device will force to redesign the antenna element and its integration inside the device almost from scratch.

For at least the above reasons, wireless device manufacturers regard the volume dedicated to the integration of the radiating structure, and in particular the antenna element as being a toll to pay in order to provide wireless capabilities to the handheld or portable device.

SUMMARY

It is an object of the present invention to provide a wireless handheld or portable device (such as for instance but not limited to a mobile phone, a smartphone, a PDA, an MP3 player, a headset, a USB dongle, a laptop computer, a gaming device, a digital camera, a PCMCIA or Cardbus 32 card, or generally a multifunction wireless device) which does not require an antenna element for the transmission and reception of electromagnetic wave signals. Such an antennaless wireless device is yet capable of operation in two or more frequency regions of the electromagnetic spectrum with enhanced radioelectric performance, increased robustness to external effects and neighboring components of the wireless device, and/or reduced interaction with the user.

Another object of the invention relates to a method to enable the operation of a wireless handheld or portable device in two or more frequency regions of the electromagnetic spectrum with enhanced radioelectric performance, increased robustness to external effects and neighboring components of the wireless device, and/or reduced interaction with the user, without requiring the use of an antenna element.

Therefore, a wireless device not requiring an antenna element would be advantageous as it would ease the integration of the radiating structure into the wireless handheld or portable device. The volume freed up by the absence of the antenna element would enable smaller and/or thinner devices, or even to adopt radically new form factors (such as for instance elastic, stretchable and/or foldable devices) which are not feasible today due to the presence of an antenna element.

Furthermore, by eliminating precisely the element that requires customization, a standard solution is obtained which only requires minor adjustments to be implemented in different wireless devices.

A wireless handheld or portable device that does not require of an antenna element, yet the wireless device featuring an adequate radioelectric performance in two or more frequency regions of the electromagnetic spectrum would be an advantageous solution. This problem is solved by an antennaless wireless handheld or portable device according to the present invention.

An antennaless wireless handheld or portable device according to the present invention operates one, two, three, four or more cellular communication standards (such as for example GSM 850, GSM 900, GSM 1800, GSM 1900, UMTS, HSDPA, CDMA, W-CDMA, LTE, CDMA2000, TD-SCDMA, etc.), wireless connectivity standards (such as for instance WiFi, IEEE802.11 standards, Bluetooth, ZigBee, UWB, WiMAX, WiBro, or other high-speed standards), and/or broadcast standards (such as for instance FM, DAB, XDARS, SDARS, DVB-H, DMB, T-DMB, or other related digital or analog video and/or audio standards), each standard being allocated in one or more frequency bands, and said frequency bands being contained within two, three or more frequency regions of the electromagnetic spectrum.

In the context of this document, a frequency band preferably refers to a range of frequencies used by a particular cellular communication standard, a wireless connectivity standard or a broadcast standard; while a frequency region preferably refers to a continuum of frequencies of the electromagnetic spectrum. For example, the GSM 1800 standard is allocated hi a frequency band from 1710 MHz to 1880 MHz while the GSM 1900 standard is allocated in a frequency band from 1850 MHz to 1990 MHz. A wireless device operating the GSM 1800 and the GSM 1900 standards must have a radiating system capable of operating in a frequency region from 1710 MHz to 1990 MHz. As another example, a wireless device operating the GSM 1800 standard and the UMTS standard (allocated in a frequency band from 1920 MHz to 2170 MHz), must have a radiating system capable of operating in two separate frequency regions.

The antennaless wireless handheld or portable device according to the present invention may have a candy-bar shape, which means that its configuration is given by a single body. It may also have a two-body configuration such as a clamshell, flip-type, swivel-type or slider structure. In some other cases, the device may have a configuration comprising three or more bodies. It may further or additionally have a twist configuration in which a body portion (e.g. with a screen) can be twisted (i.e., rotated around two or more axes of rotation which are preferably not parallel). Also, the present invention makes it possible for radically new form factors, such as for example devices made of elastic, stretchable and/or foldable materials.

For a wireless handheld or portable device which is slim and/or whose configuration comprises two or more bodies, the requirements on maximum height of the antenna element are very stringent, as the maximum thickness of each of the two or more bodies of the device may be limited to 5, 6, 7, 8 or 9 mm. The technology disclosed herein makes it possible for a wireless handheld or portable device to feature an enhanced radioelectric performance without requiring an antenna element, thus solving the space constraint problems associated to such devices.

In the context of the present document a wireless handheld or portable device is considered to be slim if it has a thickness of less than 14 mm, 13 mm, 12 mm, 11 mm, 10 mm, 9 mm or 8 mm.

According to the present invention, an antennaless wireless handheld or portable device advantageously comprises at least five functional blocks: a user interface module, a processing module, a memory module, a communication module and a power management module. The user interface module comprises a display, such as a high resolution LCD, OLED or equivalent, and is an energy consuming module, most of the energy drain coming typically from the backlight use. The user interface module may also comprise a keypad and/or a touchscreen, and/or an embedded stylus pen. The processing module, that is a microprocessor or a CPU, and the associated memory module are also major sources of power consumption. The fourth module responsible of energy consumption is the communication module, an essential part of which is the radiating system. The power management module of the antennaless wireless handheld or portable device includes a source of energy (such as for instance, but not limited to, a battery or a fuel cell) and a power management circuit that manages the energy of the device.

In accordance with the present invention, the communication module of the antennaless wireless handheld or portable device includes a radiating system capable of transmitting and receiving electromagnetic wave signals in at least two frequency regions of the electromagnetic spectrum: a first frequency region and a second frequency region, wherein preferably the highest frequency of the first frequency region is lower than the lowest frequency of the second frequency region. Said radiating system comprises a radiating structure comprising: at least one ground plane layer capable of supporting at least one radiation mode, the at least one ground plane layer including at least one connection point; at least one radiation booster to couple electromagnetic energy from/to the at least one ground plane layer, the/each radiation booster including a connection point; and at least one internal port. The/each internal port is defined between the connection point of the/each radiation booster and one of the at least one connection points of the at least one ground plane layer. The radiating system further comprises a radiofrequency system, and an external port.

In some cases, the radiating system of an antennaless wireless handheld or portable device comprises a radiating structure consisting of: at least one ground plane layer including at least one connection point; at least one radiation booster, the/each radiation booster including a connection point; and at least one internal port.

The radiofrequency system comprises a port connected to each of the at least one internal ports of the radiating structure (i.e., as many ports as there are internal ports in the radiating structure), and a port connected to the external port of the radiating system. Said radiofrequency system modifies the impedance of the radiating structure, providing impedance matching to the radiating system in the at least two frequency regions of operation of the radiating system.

In this text, a port of the radiating structure is referred to as an internal port; while a port of the radiating system is referred to as an external port. In this context, the terms "internal" and "external" when referring to a port are used simply to distinguish a port of the radiating structure from a port of the radiating system, and carry no implication as to whether a port is accessible from the outside or not.

In some examples, the radiating system is capable of operating in at least two, three, four, five or more frequency regions of the electromagnetic spectrum, said frequency regions allowing the allocation of two, three, four, five, six or more frequency bands used in one or more standards of cellular communications, wireless connectivity and/or broadcast services.

In some examples, a frequency region of operation (such as for example the first and/or the second frequency region) of a radiating system is preferably one of the following (or contained within one of the following): 824-960 MHz, 1710-2170 MHz, 2.4-2.5 GHz, 3.4-3.6 GHz, 4.9-5.875 GHz, or 3.1-10.6 GHz.

In some embodiments, the radiating structure comprises two, three, four or more radiation boosters, each of said radiation boosters including a connection point, and each of said connection points defining, together with a connection point of the at least one ground plane layer, an internal port of the radiating structure.

Therefore, in some embodiments the radiating structure comprises two, three, four or more radiation boosters, and correspondingly two, three, four or more internal ports.

In some examples, a same connection point of the at least one ground plane layer is used to define at least two, three, or even all, internal ports of the radiating structure.

In some examples, the radiating system comprises a second external port and the radiofrequency system comprises an additional port, said additional port being connected to said second external port. That is, the radiating system features two external ports.

An aspect of the present invention relates to the use of the ground plane layer of the radiating structure as an efficient radiator to provide an enhanced radioelectric performance in two or more frequency regions of operation of the wireless handheld or portable device, eliminating thus the need for an antenna element, and particularly the need for a multiband antenna element. Different radiation modes of the ground plane layer can be advantageously excited when a dimension of said ground plane layer is on the order of, or even larger than, one half of the wavelength corresponding to a frequency of operation of the radiating system.

Therefore, in an antennaless wireless device according to the present invention, no other parts or elements of the wireless handheld or portable device have significant contribution to the radiation process.

In some embodiments, at least one, two, three, or even all, of said radiation modes occur at frequencies advantageously located above (i.e., at a frequency higher than) the first frequency region of operation of the wireless handheld or portable device. In some other embodiments, the frequency of at least one radiation mode of said ground plane layer is within said first frequency region.

In some embodiments, at least one, two, or three, radiation modes of the ground plane layer is/are advantageously located above the second frequency region of operation of the wireless handheld or portable device.

A ground plane rectangle is defined as being the minimum-sized rectangle that encompasses a ground plane layer of the radiating structure. That is, the ground plane rectangle is a rectangle whose sides are tangent to at least one point of said ground plane layer.

In some cases, the ratio between a side of the ground plane rectangle, preferably a long side of the ground plane rectangle, and the free-space wavelength corresponding to the lowest frequency of the first frequency region is advantageously larger than a minimum ratio. Some possible minimum ratios are 0.1, 0.16, 0.2, 0.3, 0.4, 0.5, 0.6, 0.8, 1, 1.2 and 1.4. Said ratio may additionally be smaller than a maximum ratio (i.e., said ratio may be larger than a minimum ratio but smaller than a maximum ratio). Some possible maximum ratios are 0.4, 0.5, 0.6, 0.8, 1, 1.2, 1.4, 1.6, 2, 3, 4, 5, 6, 8 and 10.

Setting a dimension of the ground plane rectangle, preferably the dimension of its long side, relative to said free-space wavelength within these ranges makes it possible for the ground plane layer to support one, two, three or more efficient radiation modes, in which the currents flowing on the ground plane layer are substantially aligned and contribute in phase to the radiation process.

The gain of a radiating structure depends on factors such as its directivity, its radiation efficiency and its input return loss. Both the radiation efficiency and the input return loss of the radiating structure are frequency dependent (even directivity is strictly frequency dependent). A radiating structure is usually very efficient around the frequency of a radiation mode excited in the ground plane layer and maintains a similar radioelectric performance within the frequency range defined by its impedance bandwidth around said frequency. Since the dimensions of the ground plane layer (or those of the ground plane rectangle) are comparable to, or larger than, the wavelength at the frequencies of operation of the wireless device, said radiation mode may be efficient over a broad range of frequencies.

In this text, the expression impedance bandwidth is to be interpreted as referring to a frequency region over which a wireless handheld or portable device and a radiating system comply with certain specifications, depending on the service for which the wireless device is adapted. For example, for a device adapted to transmit and receive signals of cellular communication standards, a radiating system having a relative impedance bandwidth of at least 5% (and more preferably not less than 8%, 10%, 15% or 20%) together with an efficiency of not less than 30% (advantageously not less than 40%, more advantageously not less than 50%) can be preferred. Also, an input return-loss of −3d8 or better within the corresponding frequency region can be preferred.

A wireless handheld or portable device generally comprises one, two, three or more multilayer printed circuit boards (PCBs) on which to carry the electronics. In a preferred embodiment of an antennaless wireless handheld or portable device, the ground plane layer of the radiating structure is at least partially, or completely, contained in at least one of the layers of a multilayer PCB.

In some cases, a wireless handheld or portable device may comprise two, three, four or more ground plane layers. For example a clamshell, flip-type, swivel-type or slider-type wireless device may advantageously comprise two PCBs, each including a ground plane layer.

The/Each radiation booster advantageously couples the electromagnetic energy from the radiofrequency system to the ground plane layer in transmission, and from the ground plane layer to the radiofrequency system in reception. Thereby the radiation booster boosts the radiation or reception of electromagnetic radiation.

In some examples, the/each radiation booster has a maximum size smaller than 1/30, 1/40, 1/50, 1/60, 1/80, 1/100, 1/140 or even 1/180 times the free-space wavelength corresponding to the lowest frequency of the first frequency region of operation of the antennaless wireless handheld or portable device.

In some further examples, at least one (such as for instance, one, two, three or more) radiation booster has a maximum size smaller than 1/30, 1/40, 1/50, 1/60, 1/80, 1/100, 1/140 or even 1/180 times the free-space wavelength corresponding to the lowest frequency of the second frequency region of operation of said device.

An antenna element is said to be small (or miniature) when it can be fitted in a small space compared to a given operating wavelength. More precisely, a radiansphere is usually taken as the reference for classifying whether an antenna element is small. The radiansphere is an imaginary sphere having a radius equal to said operating wavelength divided by two times π. It Therefore, a maximum size of the antenna element must necessarily be not larger than the diameter of said radiansphere (i.e., approximately equal to 1/3 of the free-space operating wavelength) in order to be considered small at said given operating wavelength.

As established theoretically by H. Wheeler and L. J. Chu in the mid 1940's, small antenna elements typically have a high quality factor (Q) which means that most of the power delivered to the antenna element is stored in the vicinity of the antenna element in the form of reactive energy rather than being radiated into space. In other words, an antenna element having a maximum size smaller than 1/3 of the free-space operating wavelength may be regarded as radiating poorly by a skilled-in-the-art person.

The/Each radiation booster for a radiating structure according to the present invention has a maximum size at least smaller than 1/30 of the free-space wavelength corresponding to the lowest frequency of the first frequency region of operation. That is, the/each radiation booster fits in an imaginary sphere having a diameter ten (10) times smaller than the diameter of a radiansphere at said same operating wavelength.

Setting the dimensions of the/each radiation booster to such small values is advantageous because the radiation booster substantially behaves as a non-radiating element for all the frequencies of the first and second frequency regions, thus substantially reducing the loss of energy into free space due to undesired radiation effects of the radiation booster, and consequently enhancing the transfer of energy between the radiation booster and the ground plane layer. Therefore, the skilled-in-the-art person could not possibly regard the/each radiation booster as being an antenna element.

The maximum size of a radiation booster is preferably defined by the largest dimension of a booster box that completely encloses said radiation booster, and in which the radiation booster is inscribed.

More specifically, a booster box for a radiation booster is defined as being the minimum-sized parallelepiped of square or rectangular faces that completely encloses the radiation booster and wherein each one of the faces of said minimum-sized parallelepiped is tangent to at least a point of said radiation booster. Moreover, each possible pair of faces of said minimum-size parallelepiped sharing an edge forms an inner angle of 90°.

In those cases in which the radiating structure comprises more than one radiation booster, a different booster box is defined for each of them.

In some examples, one of the dimensions of a booster box can be substantially smaller than any of the other two dimensions, or even be close to zero. In such cases, said booster box collapses to a practically two-dimensional entity. The term dimension preferably refers to an edge between two faces of said parallelepiped.

Additionally, in some of these examples the/each radiation booster has a maximum size larger than 1/1400, 1/700, 1/350, 1/250, 1/180, 1/140 or 1/120 times the free-space wavelength corresponding to the lowest frequency of said first frequency region. Therefore, in some examples the/each radiation booster has a maximum size advantageously smaller than a first fraction of the free-space wavelength corresponding to the lowest frequency of the first frequency region but larger than a second fraction of said free-space wavelength.

Furthermore, in some of these examples, at least one, two, or three radiation boosters have a maximum size larger than 1/1400, 1/700, 1/350, 1/175, 1/120, or 1/90 times the free-space wavelength corresponding to the lowest frequency of the second frequency region of operation of the antennaless wireless handheld or portable device.

Setting the dimensions of a radiation booster to be above some certain minimum value is advantageous to obtain a higher level of the real part of the input impedance of the radiating structure (measured at the internal port of the radiating structure associated to said radiation booster when disconnected from the radiofrequency system) and in this way enhance the transfer of energy between said radiation booster and the ground plane layer.

In some other cases, preferably in combination with the above feature of an upper bound for the maximum size of a radiation booster although not always required, to reduce even further the losses in a radiation booster due to residual radiation effects, said radiation booster is designed so that the radiating structure has at the internal port of said radiating structure associated to said radiation booster, when disconnected from the radiofrequency system, a first resonance frequency at a frequency much higher than the frequencies of the first frequency region of operation. Moreover, said first resonance frequency may preferably be also much higher than the frequencies of the second frequency region of operation. In some examples, a radiation booster has a dimension substantially close to a quarter of the wavelength corresponding to the first resonance frequency at the internal port of the radiating structure associated to said radiation booster.

In a preferred example, the radiating structure features at the/each internal port, when disconnected from the radiofrequency system, a first resonance frequency located above (i.e., higher than) the first frequency region of operation of the radiating system.

In some examples, for at least some of, or even all, the internal ports of the radiating structure, the ratio between the first resonance frequency at a given internal port of the radiating structure when disconnected from the radiofrequency system and the highest frequency of said first frequency region is preferably larger than a certain minimum ratio. Some possible minimum ratios are 3.0, 3.4, 3.8, 4.0, 4.2, 4.4, 4.6, 4.8, 5.0, 5.2, 5.4, 5.6, 5.8, 6.0, 6.2, 6.6 or 7.0.

In the context of this document, a resonance frequency associated to an internal port of the radiating structure preferably refers to a frequency at which the input impedance measured at said internal port of the radiating structure, when disconnected from the radiofrequency system, has an imaginary part equal to zero.

With the/each radiation booster being so small, and with the radiating structure including said radiation booster or boosters operating in a frequency range much lower than the first resonance frequency at the/each internal port associated to the/each radiation booster, the input impedance of the radiating structure (measured at the/each internal port when the radiofrequency system is disconnected) features an important reactive component (either capacitive or inductive) within the range of frequencies of the first and/or second frequency region of operation. That is, the input impedance of the radiating structure at the/each internal port when disconnected from the radiofrequency system has an imaginary part not equal to zero for any frequency of the first and/or second frequency region.

In some examples, the first resonance frequency at an internal port is at the same time located below (i.e., at a frequency lower than) the second frequency region of operation of the radiating system. Hence, the first resonance frequency at said internal port is located above the first frequency region but below the second frequency region.

In some cases, the first resonance frequency at the/each internal port of the radiating structure is also above the second frequency region of operation of the radiating system.

In some further examples, the first resonance frequency at an internal port of the radiating structure is located above a third frequency region of operation of the radiating system, said third frequency region having a lowest frequency higher than the highest frequency of the second frequency region of operation of said radiating system.

In some examples the at least one radiation booster is substantially planar defining a two-dimensional structure, while in other cases the at least one radiation booster is a three-dimensional structure that occupies a volume. In particular, in some examples, the smallest dimension of a booster box is not smaller than a 70%, an 80% or even a 90% of the largest dimension of said booster box, defining a volumetric geometry. Radiation boosters having a volumetric geometric may be advantageous to enhance the radioelectric performance of the radiating structure, particularly in those cases in which the maximum size of the radiation booster is very small relative to the free-space wavelength corresponding to the lowest frequency of the first and/or second frequency region.

Moreover, providing a radiation booster with a volumetric geometry can be advantageous to reduce the other two dimensions of its radiator box, leading to a very compact solution. Therefore, in some examples in which the at least one radiation booster has a volumetric geometry, it is preferred to set a ratio between the first resonance frequency associated to the/each internal port of the radiating structure when disconnected from the radiofrequency system and the highest frequency of the first frequency region above 4.8, or even above 5.4.

In some advantageous examples, the radiating structure includes a first radiation booster having a volumetric geometry and a second radiation booster being substantially planar. In such examples, said first radiation booster may preferably excite a radiation mode on the ground plane layer responsible for the operation of the radiating system in the first frequency region.

In a preferred embodiment, the at least one radiation booster comprises a conductive part. In some cases said conductive part may take the form of, for instance but not limited to, a conducting strip comprising one or more segments, a polygonal shape (including for instance triangles, squares, rectangles, hexagons, or even circles or ellipses as limit cases of polygons with a large number of edges), a polyhedral shape comprising a plurality of faces (including also cylinders or spheres as limit cases of polyhedrons with a large number of faces), or a combination thereof.

In some examples, the connection point of the at least one radiation booster is advantageously located substantially close to an end, or to a corner, of said conductive part.

In another preferred example, the at least one radiation booster comprises a gap (i.e., absence of conducting material) defined in the ground plane layer. Said gap is delimited by one or more segments defining a curve. The connection point of the radiation booster is located at a first point along said curve. The connection point of the ground plane layer is located at a second point along said curve, said second point being different from said first point.

In yet another preferred example, a radiating structure includes a first radiation booster comprising a conductive part and a second radiation booster comprising a gap defined in the ground plane layer. Such an embodiment may be particularly advantageous in some cases to excite radiation modes on the ground plane layer having substantially orthogonal polarizations, or an increased level of isolation.

In a preferred example of the present invention, a major portion of the at least one radiation booster (such as at least a 50%, or a 60%, or a 70%, or an 80% of the surface of said radiation booster) is placed on one or more planes substantially parallel to the ground plane layer. In the context of this document, two surfaces are considered to be substantially parallel if the smallest angle between a first line normal to one of the two surfaces and a second line normal to the other of the two surfaces is not larger than 30°, and preferably not larger than 20°, or even more preferably not larger than 10°.

In some examples, said one or more planes substantially parallel to the ground plane layer and containing a major portion of a radiation booster of the radiating structure are preferably at a height with respect to said ground plane layer not larger than a 2% of the free-space wavelength corresponding to the lowest frequency of the first frequency region of operation of the radiating system. In some cases, said height is smaller than 7 mm, preferably smaller than 5 mm, and more preferably smaller than 3 mm.

In some embodiments, the at least one radiation booster is substantially coplanar to the ground plane layer. Furthermore, in some cases the at least one radiation booster is advantageously embedded in the same PCB as the one containing the ground plane layer, which results in a radiating structure having a very low profile.

In some cases at least two, three, four, or even all, radiation boosters are substantially coplanar to each other, and preferably also substantially coplanar to the ground plane layer.

In some cases, two or more radiation boosters may be arranged one on top of another forming for example a stacked configuration. In other cases, at least one radiation booster is arranged or embedded within another radiation booster (i.e., the booster box of said at least one radiation booster is at least partially contained within the booster box of said another radiation booster). In such cases, even more compact solutions can be obtained.

In a preferred example the radiating structure is arranged within the wireless handheld or portable device in such a manner that there is no ground plane in the orthogonal projection of a radiation booster onto the plane containing the ground plane layer. In some examples there is some overlapping between the projection of a radiation booster and the ground plane layer. In some embodiments less than a 10%, a 20%, a 30%, a 40%, a 50%, a 60% or even a 70% of the area of the projection of a radiation booster overlaps the ground plane layer. Yet in some other examples, the projection of a radiation booster onto the ground plane layer completely overlaps the ground plane layer.

In some cases it is advantageous to protrude at least a portion of the orthogonal projection of a radiation booster beyond the ground plane layer, or alternatively remove ground plane from at least a portion of the projection of a radiation booster, in order to adjust the levels of impedance and to enhance the impedance bandwidth of the radiating structure. This aspect is particularly suitable for those examples when the volume for the integration of the radiating structure has a small height, as it is the case in particular for slim wireless handheld or portable devices.

In some examples, at least one, two, three, or even all, radiation boosters are preferably located substantially close to an edge of the ground plane layer, preferably said edge being in common with a side of the ground plane rectangle. In some examples, at least one radiation booster is more preferably located substantially close to an end of said edge or to the middle point of said edge.

In some embodiments said edge is preferably an edge of a substantially rectangular or elongated ground plane layer.

In an example, a radiation booster is located preferably substantially close to a short side of the ground plane rectangle, and more preferably substantially close to an end of said short side or to the middle point of said short side. Such a placement for a radiation booster with respect to the ground plane layer is particularly advantageous when the radiating structure features at the internal port associated to said radiation booster, when the radiofrequency system is disconnected, an input impedance having a capacitive component for the frequencies of the first and second frequency regions of operation.

In another example, a radiation booster is located preferably substantially close to a long side of the ground plane rectangle, and more preferably substantially close to an end of said long side or to the middle point of said long side. Such a placement for a radiation booster is particularly advantageous when the radiating structure features at the internal port associated to said radiation booster, when the radiofrequency system is disconnected, an input impedance having an inductive component for the frequencies of said first and second frequency regions.

In some other examples, at least one radiation booster is advantageously located substantially close to a corner of the ground plane layer, preferably said corner being in common with a corner of the ground plane rectangle.

In the context of this document, two points are substantially close to each other if the distance between them is less than 5% (more preferably less than 3%, 2%, 1% or 0.5%) of the free-space wavelength corresponding to the lowest frequency of operation of the radiating system. In the same way, two linear dimensions are substantially close to each other if they differ in less than 5% (more preferably less than 3%, 2%, 1% or 0.5%) of said free-space wavelength.

In some examples, a radiating structure for a radiating system of a wireless handheld or portable device comprises a first radiation booster, a second radiation booster and a ground plane layer. The radiating structure therefore comprises two internal ports: a first internal port being defined between a connection point of the first radiation booster and the at least one connection point of the ground plane layer; and a second internal port being defined between a connection point of the second radiation booster arid said at least one connection point of the ground plane layer.

In an advantageous example, the first radiation booster is substantially close to a first corner of the ground plane layer and the second radiation booster is substantially close to a second corner of the ground plane layer (said second corner not being the same as said first corner). The first and second corners are preferably in common with two corners of the ground plane rectangle associated to said ground plane layer and, more preferably, said two corners are at opposite ends of a short side of the ground plane rectangle. Such a placement of the radiation boosters may be particularly interesting when it is necessary to achieve higher isolation between the two internal ports of the radiating structure.

In another advantageous example, and in order to facilitate the interconnection of the radiation boosters to the radiofrequency system, said first and second radiation booster are substantially close to a first corner of the ground plane layer, the first corner being preferably in common with a corner of the ground plane rectangle. In this example, preferably, the first and the second radiation boosters are such that the first internal port, when the radiofrequency system is disconnected, features an input impedance having an inductive component for the frequencies of the first and second frequency regions, and the second internal port, also when the radiofrequency system is disconnected, features an input impedance having a capacitive component for the frequencies of the first and second frequency regions.

In yet another advantageous embodiment, the first radiation booster is located substantially close to a short edge of the ground plane layer and the second radiation booster is located substantially close to a long edge of the ground plane layer. Preferably, said short edge and said long edge are in common with a short side and a long side respectively of the ground plane rectangle and meet at a corner. Such a choice of the placement of the first and second radiation boosters may be particularly advantageous to excite radiation modes on the ground plane layer having substantially orthogonal polarizations and/or to achieve an increased level of isolation between the two internal ports of the radiating structure.

In some examples, the at least one connection point of the ground plane layer is located advantageously close to the connection point of one of the at least one radiation boosters in order to facilitate the interconnection of the radiofrequency system with the radiating structure. Therefore, those locations specified above as being preferred for the placement of a radiation booster are also advantageous for the location of the at least one connection point of the ground plane layer.

Therefore, in some examples said at least one connection point is located substantially close to an edge of the ground plane layer, preferably an edge in common with a side of the ground plane rectangle, or substantially close to a corner of the ground plane layer, preferably said corner being in common with a corner of the ground plane rectangle. Such an election of the position of the at least one connection point of the ground plane layer may be advantageous to provide a longer path to the electrical currents flowing on the ground plane layer, lowering the frequency of one or more radiation modes of the ground plane layer.

In some embodiments, the radiofrequency system comprises at least one matching network (such as for instance, one, two, three, four or more matching networks) to transform the input impedance of the radiating structure, providing impedance matching to the radiating system in at least the first and second frequency regions of operation of the radiating system.

In a preferred example, the radiofrequency system comprises as many matching networks as there are radiation boosters (and, consequently, internal ports) in the radiating structure.

In another preferred example, the radiofrequency system comprises as many matching networks as there are frequency regions of operation of the radiating system. That is, in a radiating system operating for example in a first and in a second frequency region, its radiofrequency system may advantageously comprise a first matching network to provide impedance matching to the radiating system in said first frequency region and a second matching network to provide impedance matching to the radiating system in said second frequency region.

The/each matching network can comprise a single stage or a plurality of stages. In some examples, the/each matching network comprises at least two, at least three, at least four, at least five, at least six, at least seven, at least eight or more stages.

A stage comprises one or more circuit components (such as for example but not limited to inductors, capacitors, resistors, jumpers, short-circuits, switches, delay lines, resonators, or other reactive or resistive components). In some cases, a stage has a substantially inductive behavior in the frequency regions of operation of the radiating system, while another stage has a substantially capacitive behavior in said frequency regions, and yet a third one may have a substantially resistive behavior in said frequency regions.

A stage can be connected in series or in parallel to other stages and/or to one of the at least one port of the radiofrequency system.

In some examples, the at least one matching network alternates stages connected in series (i.e., cascaded) with stages connected in parallel (i.e., shunted), forming a ladder structure. In some cases, a matching network comprising two stages forms an L-shaped structure (i.e., series—parallel or parallel—series). In some other cases, a matching network comprising three stages forms either a pi-shaped structure (i.e., parallel—series—parallel) or a T-shaped structure (i.e., series—parallel—series).

In some examples, the at least one matching network alternates stages having a substantially inductive behavior, with stages having a substantially capacitive behavior.

In an example, a stage may substantially behave as a resonant circuit (such as, for instance, a parallel LC resonant circuit or a series LC resonant circuit) in at least one frequency region of operation of the radiating system (such as for instance in the first or the second frequency region). The use of stages having a resonant circuit behavior allows one part of a given matching network be effectively connected to another part of said matching network for a given range of frequencies, or in a given frequency region, and be effectively disabled for another range of frequencies, or in another frequency region.

In an example, the at least one matching network comprises at least one active circuit component (such as for instance, but not limited to, a transistor, a diode, a MEMS device, a relay, or an amplifier) in at least one stage.

In some embodiments, the/each matching network preferably includes a reactance cancellation circuit comprising one or more stages, with one of said one or more stages being connected to a port of the radiofrequency system, said port being for interconnection with an internal port of the radiating structure.

In the context of this document, reactance cancellation preferably refers to compensating the imaginary part of the input impedance at an internal port of the radiating structure when disconnected from the radiofrequency system so that the input impedance of the radiating system at an external port has an imaginary part substantially close to zero for a frequency preferably within a frequency region of operation (such as for instance, the first or the second frequency regions). In some less preferred examples, said frequency may also be higher than the highest frequency of said frequency region (although preferably not higher than 1.1, 1.2, 1.3 or 1.4 times said highest frequency) or lower than the lowest frequency of said frequency region (although preferably not lower than 0.9, 0.8 or 0.7 times said lowest frequency). Moreover, the imaginary part of an impedance is considered to be substantially close to zero if it is not larger (in absolute value) than 15 Ohms, and preferably not larger than 10 Ohms, and more preferably not larger than 5 Ohms.

In a preferred embodiment, the radiating structure features at a first internal port when the radiofrequency system is disconnected from said first internal port an input impedance having a capacitive component for the frequencies of the first and second frequency regions of operation. In that embodiment, a matching network interconnected to said first internal port (via a port of the radiofrequency system) includes a reactance cancellation circuit that comprises a first stage having a substantially inductive behavior for all the frequencies of the first and second frequency regions of operation of the radiating system. More preferably, said first stage comprises an inductor. In some cases, said inductor may be a lumped inductor. Said first stage is advantageously connected in series with said port of the radiofrequency system that is interconnected to said first internal port of the radiating structure of a radiating system.

In another preferred embodiment, the radiating structure features at a first internal port when the radiofrequency system is disconnected from said first internal port an input impedance having an inductive component for the frequencies of the first and second frequency regions of operation. In that embodiment, a matching network interconnected to said first internal port (via a port of the radiofrequency system) includes a reactance cancellation circuit that comprises a first stage and a second stage forming an L-shaped structure, with said first stage being connected in parallel and said second stage being connected in series. Each of the first and the second stage has a substantially capacitive behavior for all the frequencies of the first and second frequency regions of operation of the radiating system. More preferably, said first stage and said second stage comprise each a capacitor. In some cases, said capacitor may be a lumped capacitor. Said first stage is advantageously connected in parallel with said port of the radiofrequency system that is interconnected to said first internal port of the radiating structure of a radiating system, while said second stage is connected to said first stage.

In yet another preferred embodiment, the radiating structure comprises a first internal port that features, when said first internal port is disconnected from the radiofrequency system, an input impedance having a capacitive component for the frequencies of the first and second frequency regions of operation and a second internal port that features (also when said second internal port is disconnected from the radiofrequency system) an input impedance having an inductive component for the frequencies of the first and second frequency regions of operation.

In some embodiments, the at least one matching network may further comprise a broadband matching circuit, said broadband matching circuit being preferably connected in cascade to the reactance cancellation circuit. With a broadband matching circuit, the impedance bandwidth of the radiating structure may be advantageously increased. This may be particularly interesting for those cases in which the relative bandwidth of the first and/or second frequency region is large.

In a preferred embodiment, the broadband matching circuit comprises a stage that substantially behaves as a resonant circuit (preferably as a parallel LC resonant circuit or as a series LC resonant circuit) in one of the at least two frequency regions of operation of the radiating system.

In some examples, the at least one matching network may further comprise in addition to the reactance cancellation circuit and/or the broadband matching circuit, a fine tuning circuit to correct small deviations of the input impedance of the radiating system with respect to some given target specifications.

In a preferred example, a matching network comprises: a reactance cancellation circuit connected to a first port of the radiofrequency system, said first port being connected to an internal port of the radiating structure; and a fine tuning circuit connected to a second port of the radiofrequency system, said second port being connected to an external port of the radiating system. In an example, said matching network further comprises a broadband matching circuit operationally connected in cascade between the reactance cancellation circuit and the fine tuning circuit. In another example, said matching network does not comprise a broadband matching circuit and the reactance cancellation circuit is connected in cascade directly to the fine tuning circuit.

In some examples, at least some circuit components in the stages of the at least ne matching network are discrete lumped components (such as for instance SMT components), while in some other examples all the circuit components of the at least one matching network are discrete lumped components. In some examples, at least some circuit components in the stages of the at least one matching network are distributed components (such as for instance a transmission line printed or embedded in a PCB containing the ground plane layer of the radiating structure), while in some other examples all the circuit components of the at least one matching network are distributed components.

In some examples, at least some, or even all, circuit components in the stages of the at least one matching network may be integrated into an integrated circuit, such as for instance a CMOS integrated circuit or a hybrid integrated circuit.

In some embodiments, the radiofrequency system may comprise a frequency selective element such as a diplexer or a bank of filters to separate, or to combine, the electrical signals of the different frequency regions of operation of the radiating system.

In an example, the radiofrequency system comprises a first diplexer to separate the electrical signals of the first and second frequency regions of operation of the radiating system, a first matching network to provide impedance matching in said first frequency region, a second matching network to provide impedance matching in said second frequency region, and a second diplexer to recombine the electrical signals of said first and second frequency regions.

Alternatively, a diplexer can be replaced by a bank of band-pass filters and a combiner/splitter. Also, a diplexer and a bank of band-pass filters may be used in the radiofrequency system. Preferably, there are as many band-pass filters in the bank of band-pass filters as there are frequency regions of operation of the radiating system. Each one of the band-pass filters is designed to introduce low insertion loss in a different frequency region and to present high impedance to the combiner/splitter in the other frequency regions. The combiner/splitter combines (or splits) the electrical signals of the different frequency regions of operation of the radiating system.

In the context of this document high impedance in a given frequency region preferably refers to impedance having a modulus not smaller than 150 Ohms, 200 Ohms, 300 Ohms, 500 Ohms or even 1000 Ohms for any frequency within said frequency region, and more preferably being substantially reactive (i.e., having a real part substantially close to zero) within said given frequency region.

In some examples, one, two, three or even all the stages of the at least one matching network may contribute to more than one functionality of said at least one matching network. A given stage may for instance contribute to two or more of the following functionalities from the group comprising: reactance cancellation, impedance transformation (preferably, transformation of the real part of said impedance), broadband matching and fine tuning matching. In other words, a same stage of the at least one matching network may advantageously belong to two or three of the following circuits: reactance cancellation circuit, broadband matching circuit and fine tuning circuit. Using a same stage of the at least one matching network for several purposes may be advantageous in reducing the number of stages and/or circuit components required for the at least one matching network of a radiofrequency system, reducing the real estate requirements on the PCB of the antennaless wireless handheld or portable device in which the radiating system is integrated.

In other examples, each stage of the at least one matching network serves only to one functionality within the matching network. Such a choice may be preferred when low-end circuit components, having for instance a worse tolerance behavior, a more pronounced thermal dependence, and/or a lower quality factor, are used to implement said at least one matching network.

In some embodiments one, two, three or more radiation boosters may be advantageously arranged in an integrated circuit package (i.e., a package having a form factor for integrated circuit packages). Said integrated circuit package may advantageously comprise a semiconductor chip or die arranged inside the package. Moreover, said radiation booster or boosters is/are preferably arranged in the package but not in said semiconductor die or chip. In some of these examples, the integrated circuit package may also include at least part of, or even all, the radiofrequency system.

BRIEF DESCRIPTION OF THE DRAWINGS

Embodiments of the invention are shown in the enclosed figures. Herein shows:

FIG. 1(*b*)—Block diagram of an antennaless wireless handheld or portable device illustrating the basic functional blocks thereof.

FIG. 4(*a*)—Partial perspective view; and FIG. 4(*b*)—top plan view.

FIG. 6(*b*)—Schematic representation of a first and a second band-pass filter and a combiner/splitter used in the radiofrequency system of FIG. 5.

FIG. 7(*a*)—Input impedance at the first internal port when disconnected from the matching network of the radiofrequency system; FIG. 7(*b*)—Input impedance after connection of a reactance cancellation circuit to the first internal port; and FIG. 7(*c*)—Input impedance after connection of a broadband matching circuit in cascade with the reactance cancellation circuit.

FIG. 8(*a*)—Input impedance at the second internal port when disconnected from the matching network of the radiofrequency system; FIG. 8(*b*)—Input impedance after connection of a reactance cancellation circuit to the second internal port; and FIG. 8(*c*)—Input impedance after connection of a broadband matching circuit in cascade with said reactance cancellation circuit.

FIG. 9(*b*)—Typical input return losses at the second internal port of the radiating structure of FIGS. 4(*a*) and 4(*b*) compared with those after interconnection of a matching network similar to that of FIGS. 6(*a*) and 6(*b*) to the second internal port of the radiating structure.

DETAILED DESCRIPTION

Further characteristics and advantages of the invention will become apparent in view of the detailed description of some preferred embodiments which follows. Said detailed description of some preferred embodiments of the invention is given for purposes of illustration only and in no way is meant as a definition of the limits of the invention, made with reference to the accompanying figures.

Figure 1A:
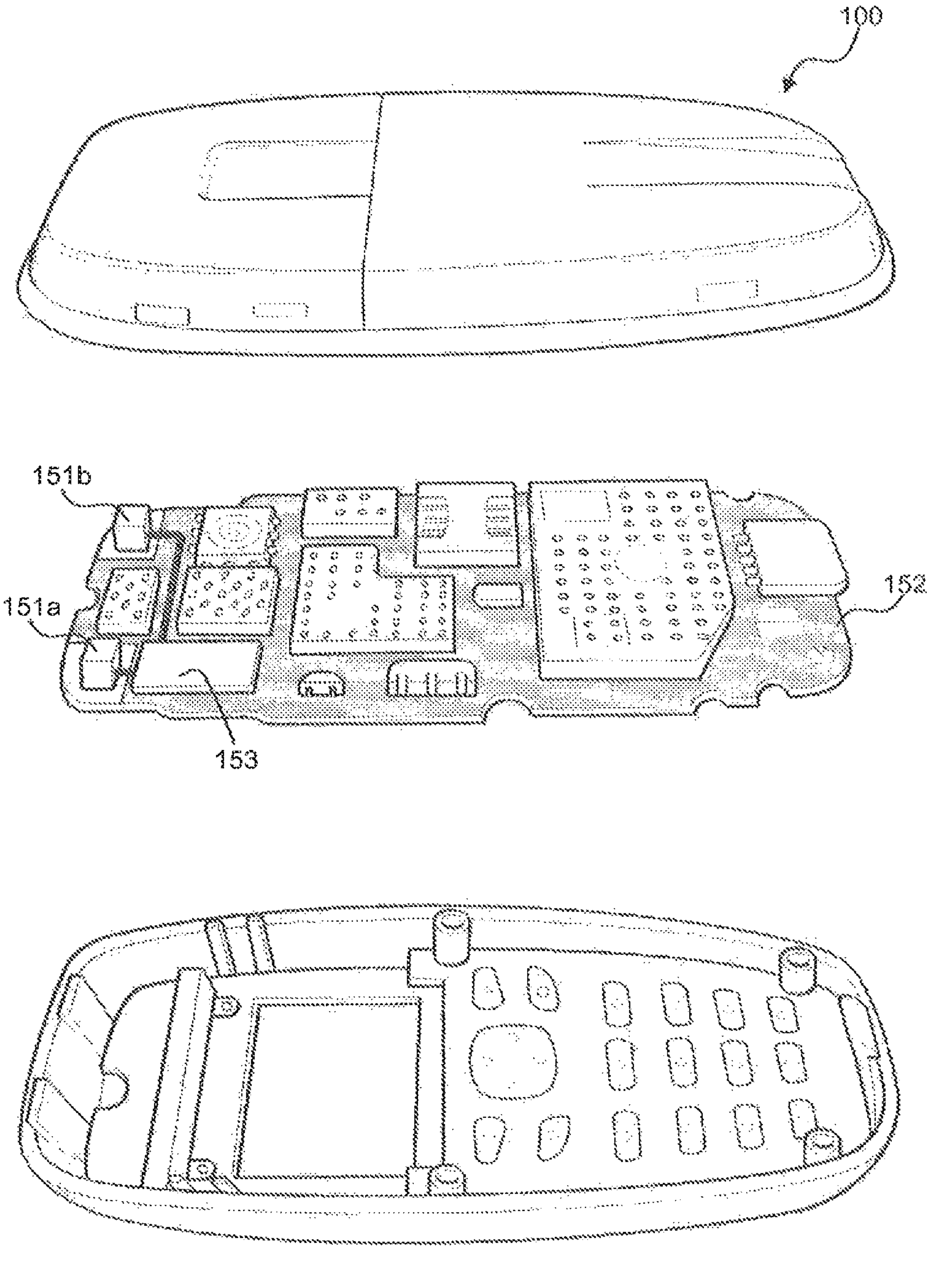
FIG. 1(*a*)—Example of an antennaless wireless handheld or portable device including a radiating system according to the present invention.

FIG. 1 shows an illustrative example of an antennaless wireless handheld or portable device 100 capable of multiband operation according to the present invention. In FIG. 1*a*, there is shown an exploded perspective view of the antennaless wireless handheld or portable device 100 comprising a radiating structure that includes a first radiation booster 15*a*, a second radiation booster 151*b* and a ground plane layer 152 (which could be included in a layer of a multilayer PCB). The antennaless wireless handheld or portable device 100 also comprises a radiofrequency system 153, which is interconnected with said radiating structure.

Figure 1B:
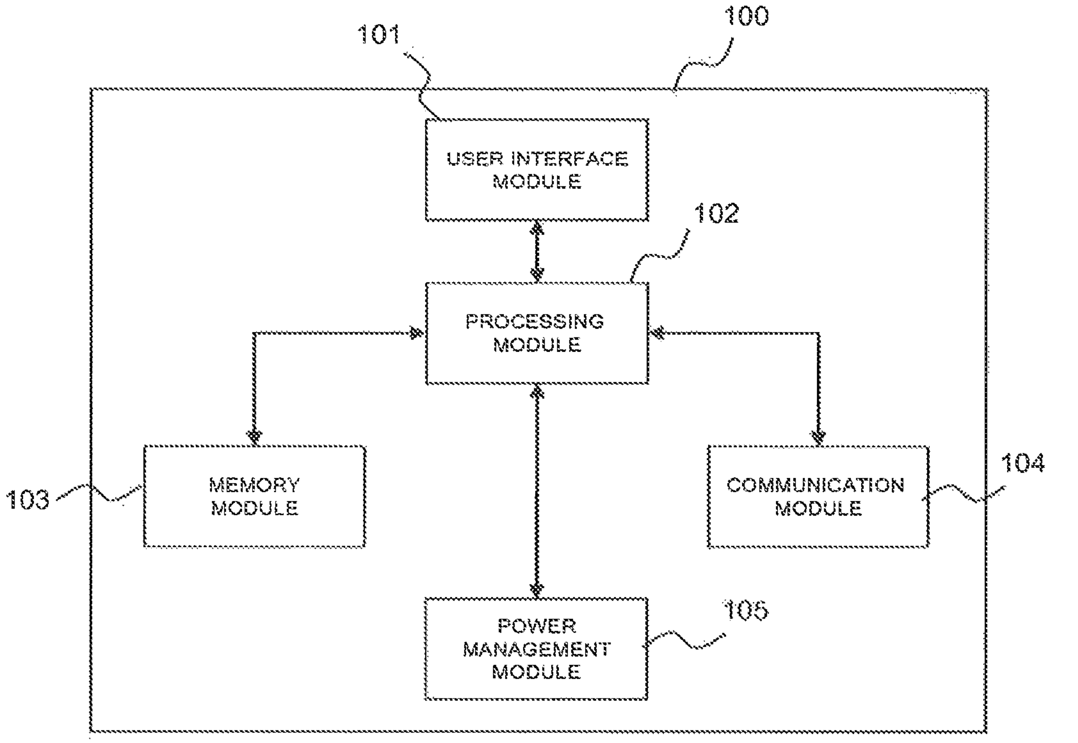

Referring now to FIG. 1*b*, it is shown a block diagram of the antennaless wireless handheld or portable device 100 capable of multiband operation advantageously comprising, in accordance to the present invention, a user interface module 101, a processing module 102, a memory module 103, a communication module 104 and a power management module 105. In a preferred embodiment, the processing module 102 and the memory module 103 have herein been listed as separate modules. However, in another embodiment, the processing module 102 and the memory module 103 may be separate functionalities within a single module or a plurality of modules. In a further embodiment, two or more of the five functional blocks of the antennaless wireless handheld or portable device 100 may be separate functionalities within a single module or a plurality of modules.

In FIG. 2, it is shown a schematic representation of three examples of radiating systems for an antennaless wireless handheld or portable device capable of multiband operation according to the present invention.

Figure 2A:
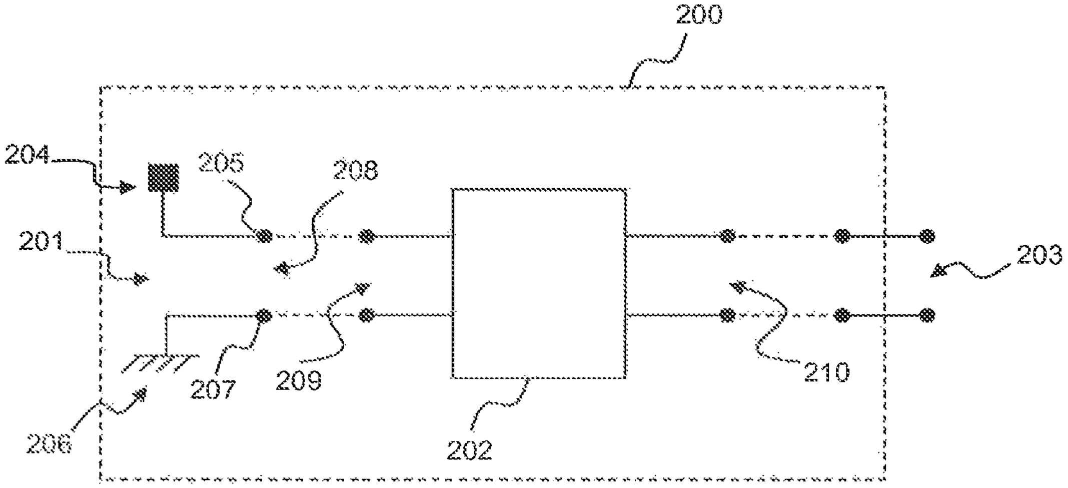
FIGS. 2(*a*)-2(*c*)—Schematic representations of three examples of radiating systems according to the present invention.

In particular, in FIG. 2*a* a radiating system 200 comprises a radiating structure 201, a radiofrequency system 202, and an external port 203. The radiating structure 201 comprises a radiation booster 204, which includes a connection point 205, and a ground plane layer 206, said ground plane layer also including a connection point 207. The radiating structure 201 further comprises an internal port 208 defined between the connection point of the radiation booster 205 and the connection point of the ground plane layer 207. Furthermore, the radiofrequency system 202 comprises two ports: a first port 209 is connected to the internal port of the radiating structure 208, and a second port 210 is connected to the external port of the radiating system 203.

Figure 2B:
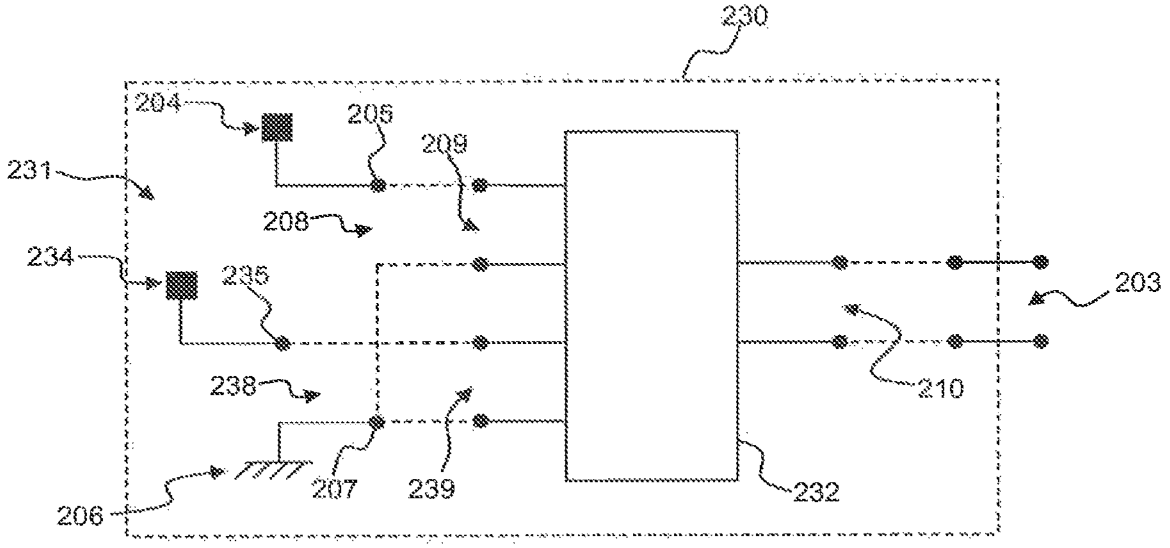

Referring now to FIG. 2*b*, a radiating system 230 comprises a radiating structure 231, which, in addition to a first radiation booster 204 and a ground plane layer 206, also includes a second radiation booster 234. The radiating structure 231 comprises two internal ports: A first internal port 208 is defined between a connection point of the first radiation booster 205 and a connection point of the ground plane layer 207; while a second internal port 238 is defined between a connection point of the second radiation booster 235 and the same connection point of the ground plane layer 207.

The radiating system 230 comprises a radiofrequency system 232 including three ports: A first port 209 is connected to the first internal port 208; a second port 239 is connected to the second internal port 238; and a third port 210 is connected to the external port of the radiating system 203. That is, the radiofrequency system 232 comprises a port connected to each of the at least one internal ports of the radiating structure 231, and a port connected to the external port of the radiating system 203.

Figure 2C:
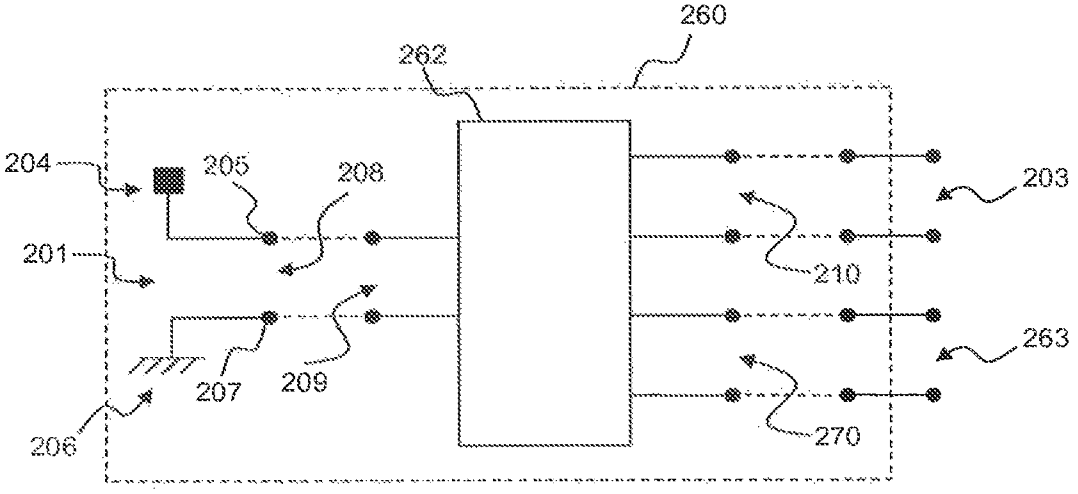

FIG. 2*c* depicts a further example of a radiating system 260 having the same radiating structure 201 as in the example of FIG. 2*a*. However, differently from the example of FIG. 2*a*, the radiating system 260 comprises an additional external port 263.

The radiating system 260 includes a radiofrequency system 262 having a first port 209 connected to the internal port of the radiating structure 208, a second port 210 connected to the external port 203, and a third port 270 connected to the additional external port 263.

Such a radiating system 260 may be preferred when said radiating system 260 is to provide operation in at least one cellular communication standard and at least one wireless connectivity standard. In one example, the external port 203 may provide the GSM 900 and GSM 1800 standards, while the external port 263 may provide an IEEE802.11 standard.

FIG. 3 shows the block diagram of three preferred examples of a matching network 300 for a radiofrequency system, the matching network 300 comprising a first port 301 and a second port 302. One of said two ports may at the same time be a port of a radiofrequency system and, in particular, be interconnected with an internal port of a radiating structure.

Figure 3A:
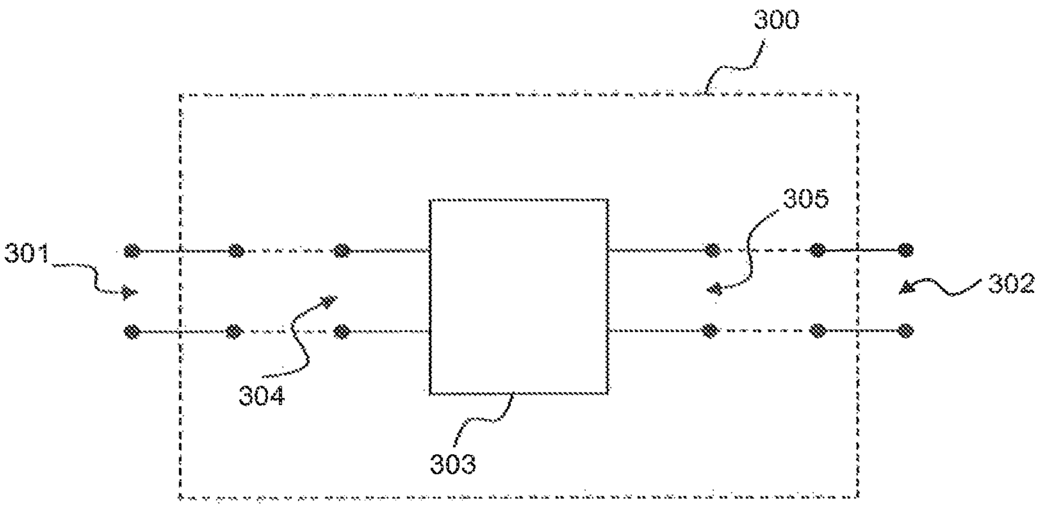
FIGS. 3(*a*)-3(*c*)—Block diagrams of three examples of matching networks for a radiofrequency system used in a radiating system according to the present invention.

In FIG. 3*a* the matching network 300 comprises a reactance cancellation circuit 303. In this example, a first port of the reactance cancellation circuit 304 may be operationally connected to the first port of the matching network 301 and another port of the reactance cancellation circuit 305 may be operationally connected to the second port of the matching network 302.

Figure 3B:
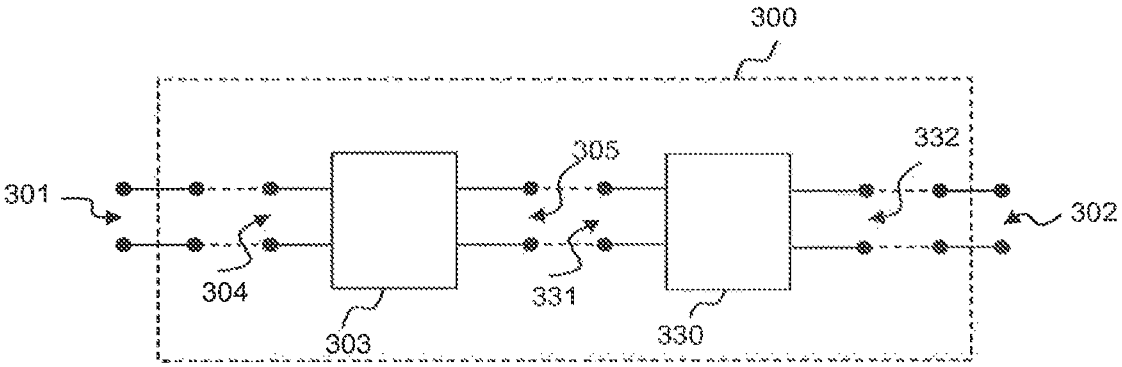

Referring now to FIG. 3*b*, the matching network 300 comprises the reactance cancellation circuit 303 and a broadband matching circuit 330, which is advantageously connected in cascade with the reactance cancellation circuit 303. That is, a port of the broadband matching circuit 331 is connected to port 305. In this example, port 304 is operationally connected to the first port of the matching network 301, while another port of the broadband matching circuit 332 is operationally connected to the second port of the matching network 302.

Figure 3C:
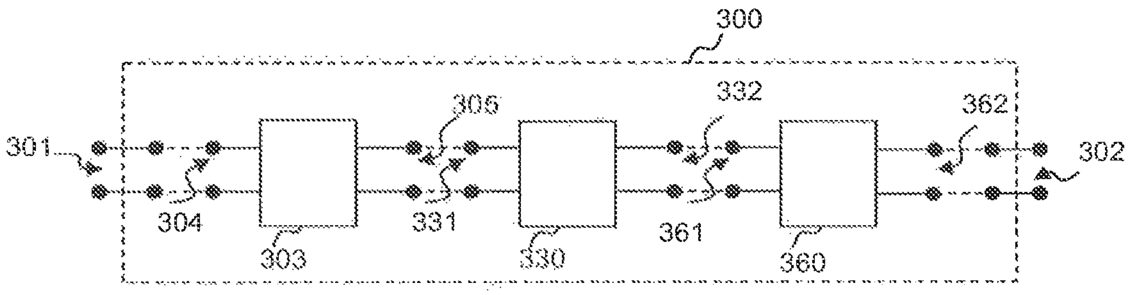

FIG. 3*c* depicts a further example of the matching network 300 comprising, in addition to the reactance cancellation circuit 303 and the broadband matching circuit 330, a fine tuning circuit 360. Said three circuits are advantageously connected in cascade, with a port of the reactance cancellation circuit (in particular port 304) being connected to the first port of the matching network 301 and a port the fine tuning circuit 362 being connected to the second port of the matching network 302. In this example, the broadband matching circuit 330 is operationally interconnected between the reactance cancellation circuit 303 and the fine tuning circuit 360 (i.e., port 331 is connected to port 305 and port 332 is connected to port 361 of the fine tuning circuit 360).

The radiofrequency systems 202, 232, 262 in the example radiating systems of FIG. 2 may advantageously include at least one, and preferably two, matching networks such as the matching network 300 of FIGS. 3*a-c*.

Figure 4A:
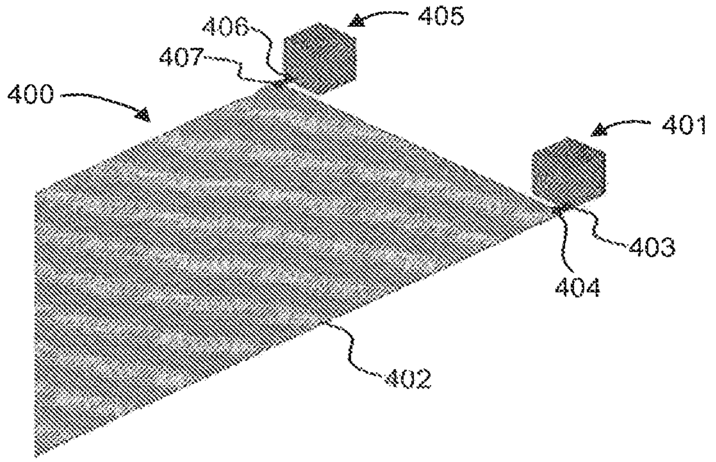
FIGS. 4(*a*) and 4(*b*)—Example of a radiating structure for a radiating system, the radiating structure including a first and a second radiation booster, each comprising a conductive part.

FIG. 4 shows a preferred example of a radiating structure suitable for a radiating system operating in a first frequency region of the electromagnetic spectrum between 824 MHz and 960 MHz and in a second frequency region of the electromagnetic spectrum between 1710 MHz and 2170 MHz. An antennaless wireless handheld or portable device including such a radiating system may advantageously operate the GSM 850, GSM 900, GSM1800, GSM1900 and UMTS cellular communication standards (i.e., five different communication standards).

Figure 4B:
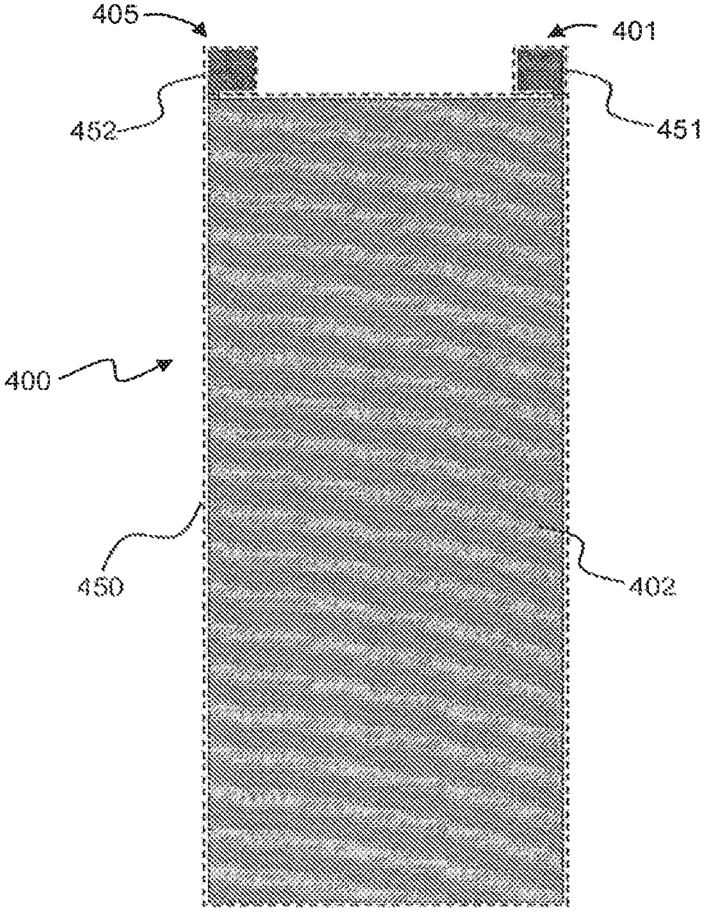

The radiating structure 400 comprises a first radiation booster 401, a second radiation booster 405, and a ground plane layer 402. In FIG. 4*b*, there is shown in a top plan view the ground plane rectangle 450 associated to the ground plane layer 402. In this example, since the ground plane layer 402 has a substantially rectangular shape, its ground plane rectangle 450 is readily obtained as the rectangular perimeter of said ground plane layer 402.

The ground plane rectangle 450 has a long side of approximately 100 mm and a short side of approximately 40 mm. Therefore, in accordance with an aspect of the present invention, the ratio between the long side of the ground plane rectangle 450 and the free-space wavelength corresponding to" the lowest frequency of the first frequency region (i.e., 824 MHz) is advantageously larger than 0.2. Moreover, said ratio is advantageously also smaller than 1.0.

In this example, the first radiation booster 401 and the second radiation booster 405 are of the same type, shape and size. However, in other examples the radiation boosters 401, 405 could be of different types, shapes and/or sizes. Thus, in FIG. 4 each of the first and the second radiation boosters 401, 405 includes a conductive part featuring a polyhedral shape comprising six faces. Moreover, in this case said six faces are substantially square having an edge length of approximately 5 mm, which means that said conductive part is a cube.

In this case, the conductive part of each of the two radiation boosters 401, 405 is not connected to the ground plane layer 402. A first booster box 451 for the first radiation booster 401 coincides with the external area of said first radiation booster 401. Similarly, a second booster box 452 for the second radiation booster 405 coincides with the external area of said second radiation booster 405. In FIG. 4*b*, it is shown a top plan view of the radiating structure 400, in which the top face of the first booster box 451 and that of the second booster box 452 can be observed.

In accordance with an aspect of the present invention, a maximum size of the first radiation booster 401 (said maximum size being a largest edge of the first booster box 451) is advantageously smaller than 1/50 times the free-space wavelength corresponding to the lowest frequency of the first frequency region of operation of the radiating structure 400, and a maximum size of the second radiation booster 405 (said maximum size being a largest edge of the second booster box 452) is also advantageously smaller than 1/50 times said free-space wavelength. In particular, said maximum sizes of the first and second radiation boosters 401, 405 are also advantageously larger than 1/180 times said free-space wavelength.

Furthermore in this example, the first and second radiation boosters have each a maximum size smaller than 1/30 times the free-space wavelength corresponding to the lowest frequency of the second frequency region of operation of the radiating structure 400, but advantageously larger than 1/120 times said free-space wavelength.

In FIG. 4, the first and second radiation boosters 401, 405 are arranged with respect to the ground plane layer 402 so that the upper and bottom faces of the first radiation booster 401 and the upper and bottom faces of the second radiation booster 405 are substantially parallel to the ground plane layer 402. Moreover, the bottom face of the first radiation booster 401 is advantageously coplanar to the bottom face of the second radiation booster 405, and the bottom faces of both radiation boosters 401, 405 are also advantageously coplanar to the ground plane layer 402. With such an arrangement, the height of the radiation boosters 401, 405 with respect to the ground plane layer is not larger than 2% of the free-space wavelength corresponding to the lowest frequency of the first frequency region.

In the radiating structure 400, the first radiation booster 401 and the second radiation booster 405 protrude beyond the ground plane layer 402. That is, the radiation boosters 401, 405 are arranged with respect to the ground plane layer 402 in such a manner that there is no ground plane in the orthogonal projection of the radiation boosters 401, 405 onto the plane containing the ground plane layer 402. The first radiation booster 401 is located substantially close to a first corner of the ground plane layer 402, while the second radiation booster 405 is located substantially close to a second corner of said ground plane layer 402. In particular, said first and second corners are at opposite ends of a short edge of the substantially rectangular ground plane layer 402.

The first radiation booster 401 comprises a connection point 403 located on the lower right corner of the bottom face of the first radiation booster 401. In turn, the ground plane layer 402 also comprises a first connection point 404 substantially on the upper right corner of the ground plane layer 402. A first internal port of the radiating structure 400 is defined between said connection point 403 and said first connection point 404.

Similarly, the second radiation booster 405 comprises a connection point 406 located on the lower left corner of the bottom face of the second radiation booster 405, and the ground plane layer 402 also comprises a second connection point 407 substantially on the upper left corner of the ground plane layer 402. A second internal port of the radiating structure 400 is defined between said connection point 406 and said second connection point 407.

In an alternative example, the ground plane layer 402 of the radiating structure 400 may comprise only the first connection point 404 (i.e., only one connection point). In that case the second internal port could have been defined between the connection point 406 of the second radiation booster 405 and said first connection point 404.

The very small dimensions of the first and second radiation boosters 401, 405 result in said radiating structure 400 having at each of the first and second internal ports a first resonance frequency at a frequency much higher than the frequencies of the first frequency region. In this case, the ratio between the first resonance frequency of the radiating structure 400 measured at each of the first and second internal ports (in absence of a radiofrequency system connected to them) and the highest frequency of the first frequency region is advantageously larger than 4.2.

Furthermore, the first resonance frequency at each of the first and second internal ports of the radiating structure 400 is also at a frequency much higher than the frequencies of the second frequency region.

Figure 7A:
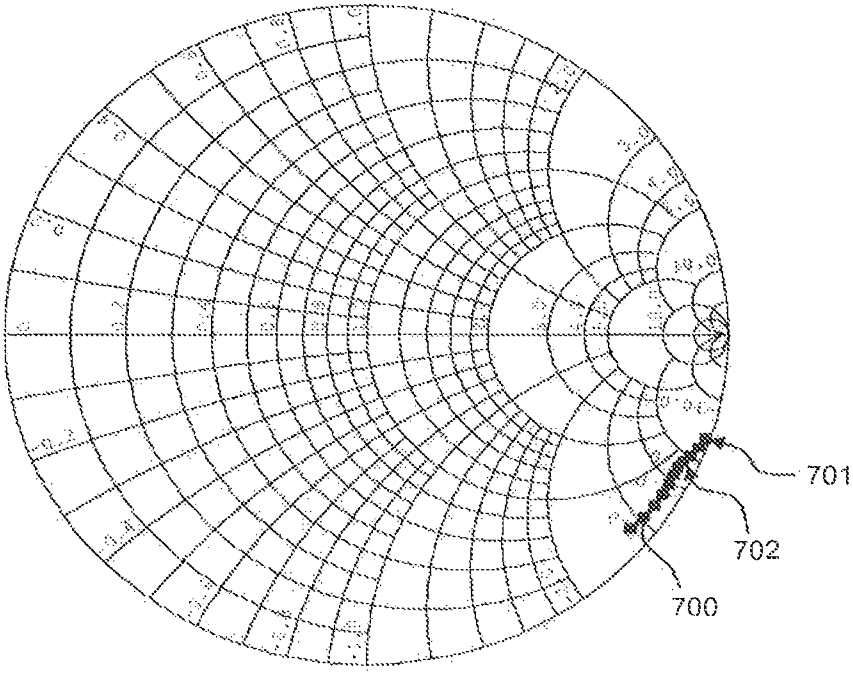
FIGS. 7(*a*)-7(*c*)—Typical impedance transformation caused by the matching network of FIGS. 6(*a*) and 6(*b*) on the input impedance at the first internal port of the radiating structure of FIGS. 4(*a*) and 4(*b*)
Figure 8A:
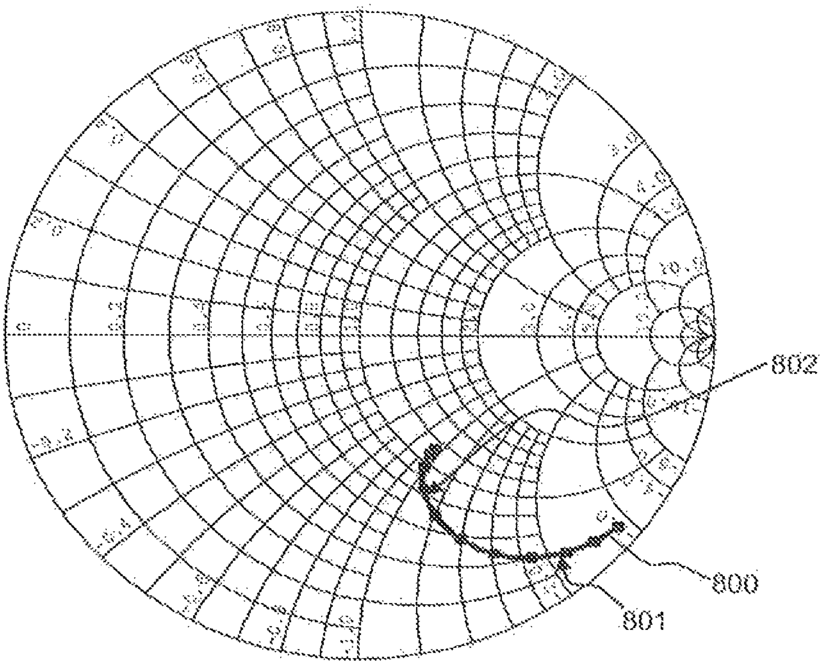
FIGS. 8(*a*)-8(*c*)—Typical impedance transformation caused by a matching network similar to that of FIGS. 6(*a*) and 6(*b*) on the input impedance at the second internal port of the radiating structure of FIGS. 4(*a*) and 4(*b*)

With such small dimensions of the first and second radiation boosters 401, 405, the input impedance of the radiating structure 400 measured at each of the first and second internal ports features an important reactive component, and in particular a capacitive component, within the frequencies of the first and second frequency regions, as it can be observed in FIGS. 7*a* and 8*a*.

In FIG. 7*a*, curve 700 represents on a Smith chart the typical complex impedance at the first internal port of the radiating structure 400 as a function of the frequency when no radiofrequency system is connected to said first internal port. In particular, point 701 corresponds to the input impedance at the lowest frequency of the first frequency region, and point 702 corresponds to the input impedance at the highest frequency of the first frequency region.

Curve 700 is located on the lower half of the Smith chart, which indeed indicates that the input impedance at the first internal port has a capacitive component (i.e., the imaginary part of the input impedance has a negative value) for at least all frequencies of the first frequency range (i.e., between point 701 and point 702). Although not represented in FIG. 7*a*, the input impedance at the first internal port has also a capacitive component for all frequencies of the second frequency region (i.e., curve 700 remains in the lower half of the Smith chart for all frequencies of the second frequency region).

As far as the second internal port of the radiating structure 400 is concerned, curve 800 in FIG. 8*a* represents the typical complex impedance at said second internal port as a function of the frequency in absence of any radiofrequency system connected to it. Point 801 corresponds to the input impedance at the lowest frequency of the second frequency region, and point 802 corresponds to the input impedance at the highest frequency of the second frequency region.

Curve 800 is also located on the lower half of the Smith chart, indicating that the input impedance at the second internal port has a capacitive component for at least all frequencies of the second frequency range (i.e., between point 801 and point 802). Moreover, despite not being shown in FIG. 8*a*, the input impedance at the second internal port has also a capacitive component for all frequencies of the first frequency region (i.e., curve 800 remains in the lower half of the Smith chart for all frequencies of the first frequency region).

Figure 5:
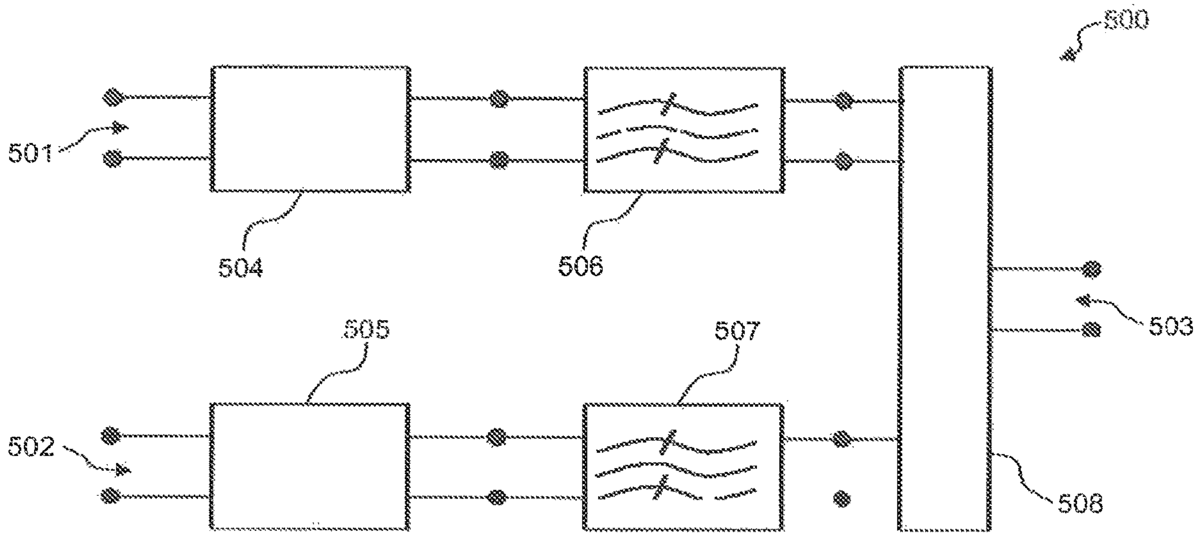
FIG. 5—Schematic representation of a radiofrequency system for a radiating system whose radiating structure is shown in FIGS. 4(*a*) and 4(*b*).

FIG. 5 presents a schematic of a radiofrequency system 500 to be connected to the two internal ports of the radiating structure 400 in order to transform the input impedance of the radiating structure 400 and provide impedance matching in the first and second regions of operation of the radiating system.

The radiofrequency system 500 comprises two ports 501, 502 to be connected respectively to the first and second internal ports of the radiating structure 400, and a third port 503 to be connected to a single external port of the radiating system.

The radiofrequency system 500 also comprises a first matching network 504 connected to port 501, providing impedance matching within the first frequency region; and a second matching network 505 connected to port 502, providing impedance matching within the second frequency region.

The radiofrequency system 500 further comprises a first band-pass filter 506 connected to said first matching network 504, and a second band-pass filter 507 connected to said second matching network 505. The first band-pass filter 506 is designed to present low insertion loss in the first frequency region and high impedance in the second frequency region of operation of the radiating system.

Analogously, the second band-pass filter 507 is designed to present low insertion loss in said second frequency region and high impedance in said first frequency region.

The radiofrequency system 500 additionally includes a combiner/splitter 508 to combine (or split) the electrical signals of different frequency regions. Said combiner/splitter 508 is connected to the first and second band-pass filters 506, 507, and to the port 503.

Figure 6A:
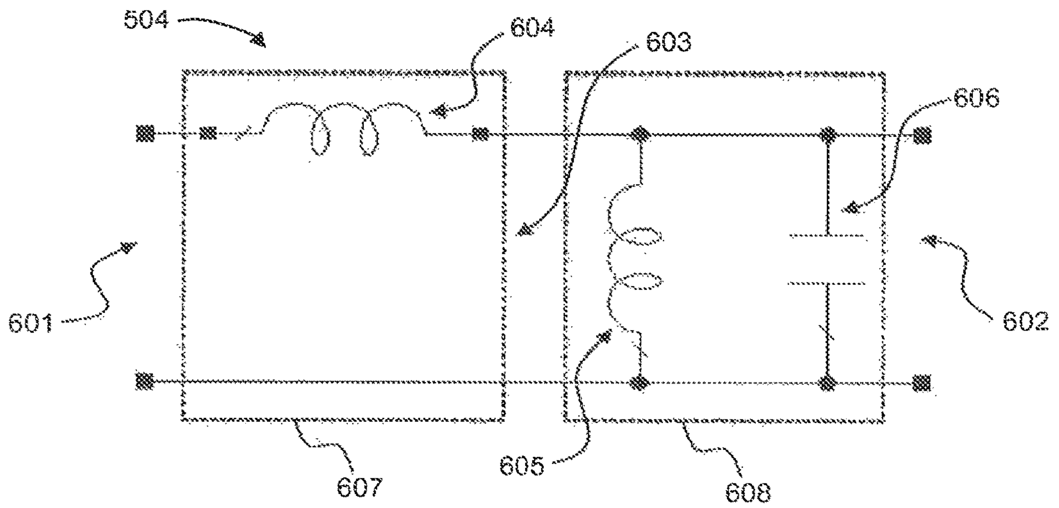
FIG. 6(*a*)—Schematic representation of a matching network used in the radiofrequency system of FIG. 5.
Figure 6B:
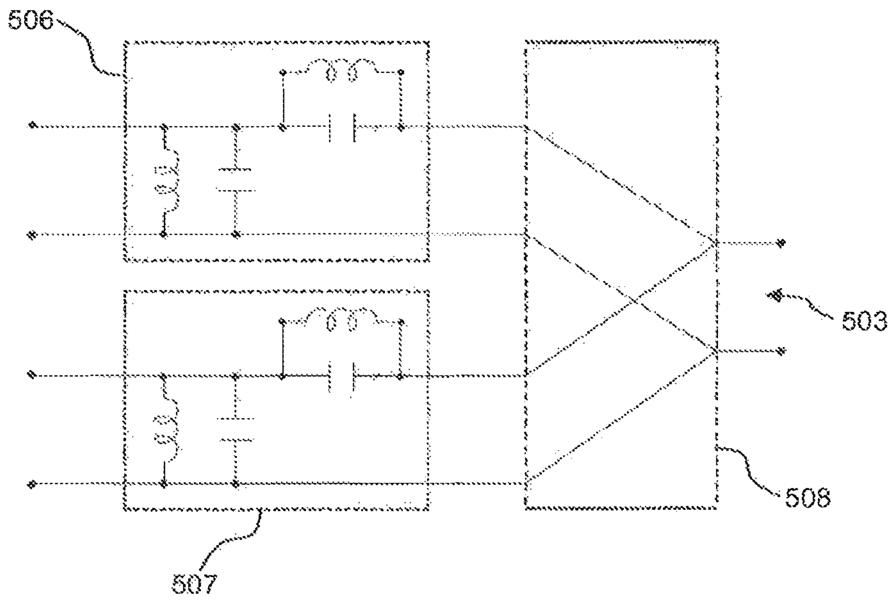

FIG. 6*b* shows a schematic representation of the first and second band-pass filters 506, 507 and the combiner/splitter 508.

The first and second band-pass filters 506, 507 comprise each at least two stages, and preferably at least one of said at least two stages includes an LC resonant circuit. In the particular example shown in FIG. 6*b*, the first and the second band-pass filter 506, 507 have each two stages in an L-shaped (i.e., parallel—series) arrangement. Furthermore, each of said two stages includes an LC-resonant circuit formed by a Jumped capacitor in parallel with a lumped inductor.

In some examples, the combiner/splitter 508 can be advantageously constructed by directly connecting in parallel the two band-pass filters 506, 507 to the port 503, as it is shown in the example of FIG. 6*b*. This is possible because in the first frequency region the second band-pass filter 507 does not load the port 503, while in the second frequency region the first band-pass filter 506 does not load the port 503. In other words, it is as if only one of the two matching networks were effectively connected to the port 503 in each frequency region.

FIG. 6*a* is a schematic representation of the matching network 504, which comprises a first port 601 to be connected to the first internal port of the radiating structure 400 (via the port 501 of the radiofrequency system 500), and a second port 602 to be connected to the first band-pass filter 506 of the radiofrequency system 500. In this example, the matching network 504 further comprises a reactance cancellation circuit 607 and a broadband matching circuit 608.

The reactance cancellation circuit 607 includes one stage comprising one single circuit component 604 arranged in series and featuring a substantially inductive behavior in the first and second frequency regions. In this particular example, the circuit component 604 is a lumped inductor. The inductive behavior of the reactance cancellation circuit 607 advantageously compensates the capacitive component of the input impedance of the first internal port of the radiating structure 400.

Figure 7B:
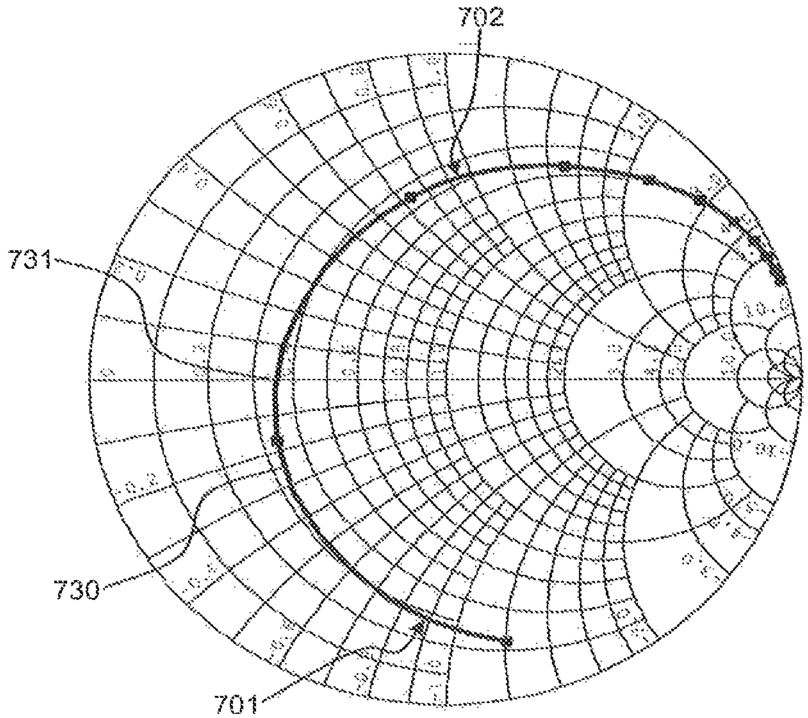

Such a reactance cancellation effect can be observed in FIG. 7*b*, in which the input impedance at the first internal port of the radiating structure 400 (curve 700 in FIG. 7*a*) is transformed by the reactance cancellation circuit 607 into an impedance having an imaginary part substantially close to zero in the first frequency region (see FIG. 7*b*). Curve 730 in FIG. 7*b* corresponds to the input impedance that would be observed at the second port 602 of the first matching network 504 (when disconnected from the first band-pass filter 506) if the broadband matching circuit 608 were removed and said second port 602 were directly connected to a port 603. Said curve 730 crosses the horizontal axis of the Smith Chart at a point 731 located between point 701 and point 702, which means that the input impedance at the first internal port of the radiating structure 400 has an imaginary part equal to zero for a frequency advantageously between the lowest and highest frequencies of the first frequency region.

The broadband matching circuit 608 includes also one stage and is connected in cascade with the reactance cancellation circuit 607. Said stage of the broadband matching circuit 608 comprises two circuit components: a first circuit component 605 is a lumped inductor and a second circuit component 606 is a lumped capacitor. Together, the circuit components 605 and 606 form a parallel LC resonant circuit (i.e., said stage of the broadband matching circuit 608 behaves substantially as a resonant circuit in the first frequency region of operation).

Figure 7C:
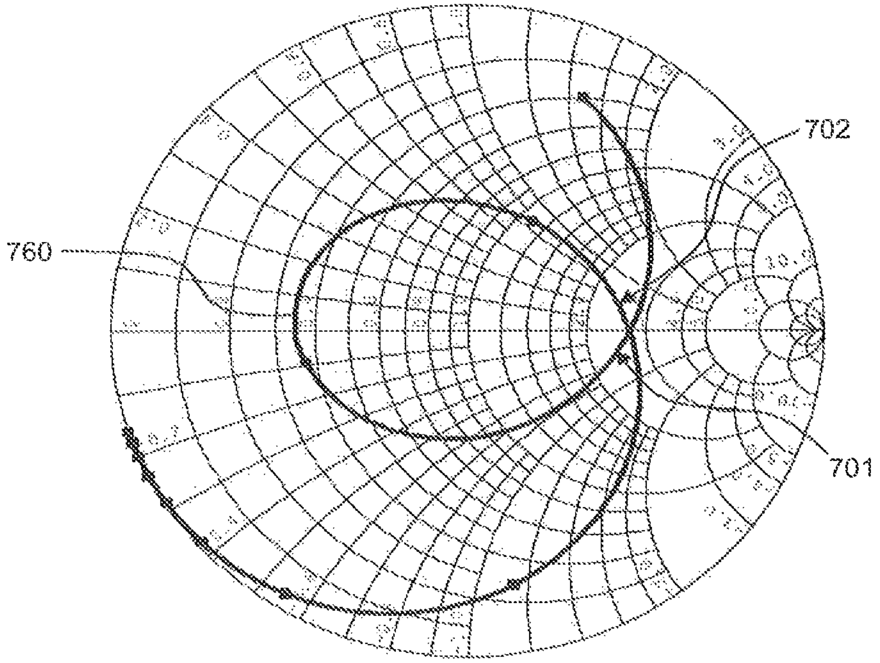

Comparing FIGS. 7*b* and 7*c*, it is noticed that the broadband matching circuit 608 has the beneficial effect of "closing in" the ends of curve 730 (i.e., transforming the curve 730 into another curve 760 featuring a compact loop around the center of the Smith chart). Thus, the resulting curve 760 exhibits an input impedance (now, measured at the second port 602 when disconnected from the first band-pass filter 506) within a voltage standing wave ratio (VSWR) 3:1 referred to a reference impedance of 50 Ohms over a broader range of frequencies.

In this particular example, the second matching network 505 of the radiofrequency system 500 has the same configuration as that of the first matching network 504 shown in FIG. 6*a*: A reactance cancellation circuit that includes one stage comprising one single circuit component arranged in series and featuring a substantially inductive behavior in the first and second frequency regions; and a broadband matching circuit connected in cascade with the reactance cancellation circuit and that includes also one stage, said stage comprising two circuit components that form a parallel LC resonant circuit so that said stage behaves substantially as a resonant circuit in the second frequency region of operation. Said second matching network also comprises a first port to be connected to the second internal port of the radiating structure 400 (via the port 502 of the radiofrequency system 500), and a second port to be connected to the second band-pass filter 507.

Despite the fact that the first and second matching networks 504, 505 have the same configuration, the different frequency ranges in which each matching network is to provide impedance matching makes the actual values of the circuit components used in each matching network be possibly different.

The effect of the reactance cancellation circuit of the second matching network 505 on the input impedance at the second internal port of the radiating structure 400 is shown in FIG. Sb, in which the input impedance at said second internal port (curve 800 in FIG. Sa) is transformed into an impedance having an imaginary part substantially close to zero in the second frequency region. Curve 830 in FIG. 8*b* corresponds to the input impedance that would be observed at the second port of the second matching network 505 (when disconnected from the first band-pass filter 507) if said second matching network 505 had only a reactance cancellation circuit operationally connected between its first and second ports. Said curve 830 crosses the horizontal axis of the Smith Chart at a point 831 located between point 801 and point 802, which means that the input impedance at the second internal port of the radiating structure 400 has an imaginary part equal to zero for a frequency advantageously between the lowest and highest frequencies of the second frequency region.

Figure 8B:
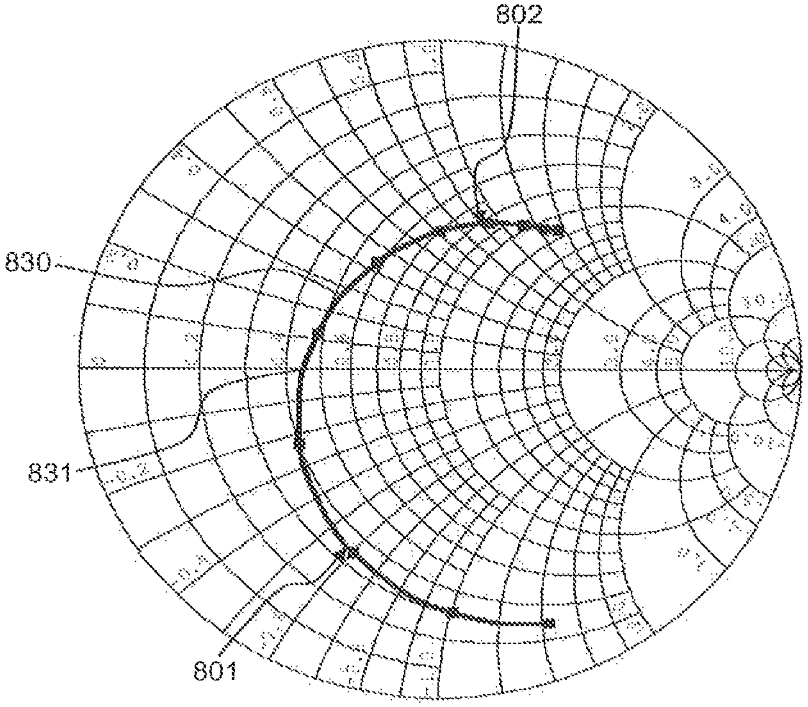
Figure 8C:
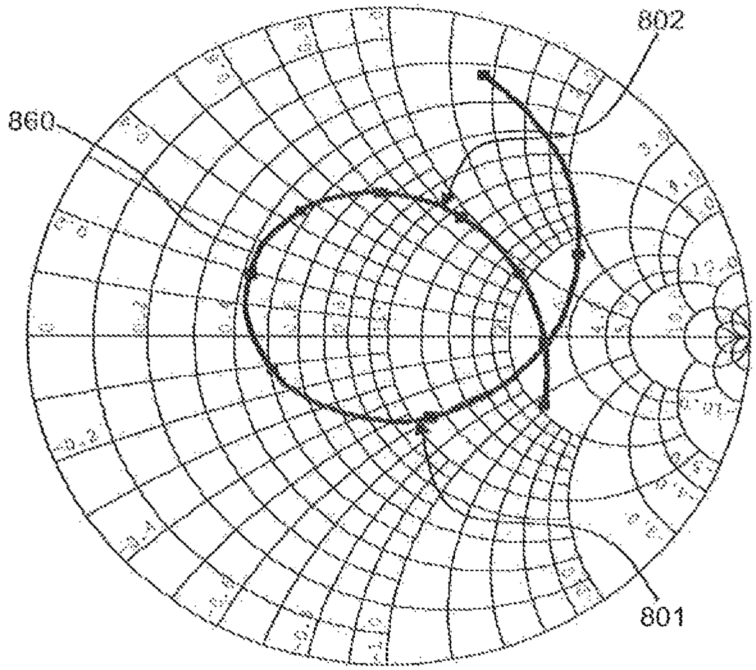

Finally, the broadband matching circuit of the second matching network 505 transforms the curve 830 in FIG. 8*b* into another curve 860 (in FIG. 8*c*) that features a compact loop around the center of the Smith chart. Thus, the resulting curve 860 exhibits an input impedance (now, measured at the second port of the second matching network 505 when disconnected from the second band-pass filter 507) within a VSWR 3:1 referred to a reference impedance of 50 Ohms over a broader range of frequencies.

Figure 9A:
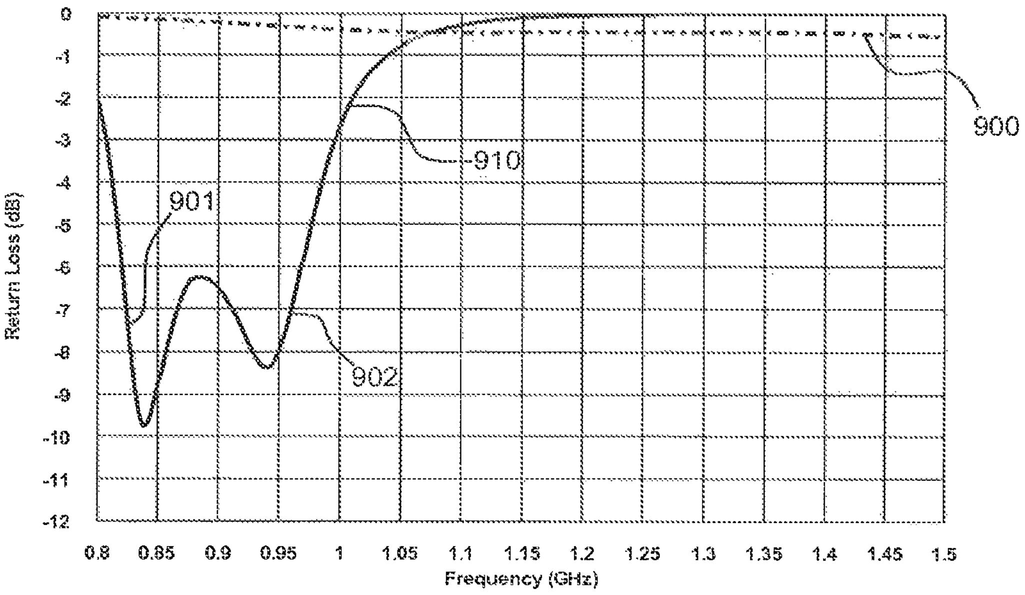
FIG. 9(*a*)—Typical input return losses at the first internal port of the radiating structure of FIGS. 4(*a*) and 4(*b*) compared with those after interconnection of the matching network of FIGS. 6(*a*) and 6(*b*) to the first internal port of the radiating structure.

Alternatively, the effect of the first and second matching networks of the radiofrequency system of FIG. 5 on the radiating structure of FIG. 4 can be compared in terms of the input return loss. In FIG. 9*a* curve 900 (in dash-dotted line) presents the typical input return loss of the radiating structure 400 observed at its first internal port when the radiofrequency system 500 is not connected to said first internal port. From said curve 900 it is clear that the radiating structure 400 is not matched in the first frequency region and that the first radiation booster 401 is non-resonant in said first frequency region. On the other hand, curve 910 (in solid line) corresponds to the input return losses at the second port 602 of the first matching network 504 (when disconnected fro the first band-pass filter 506).

Figure 9B:
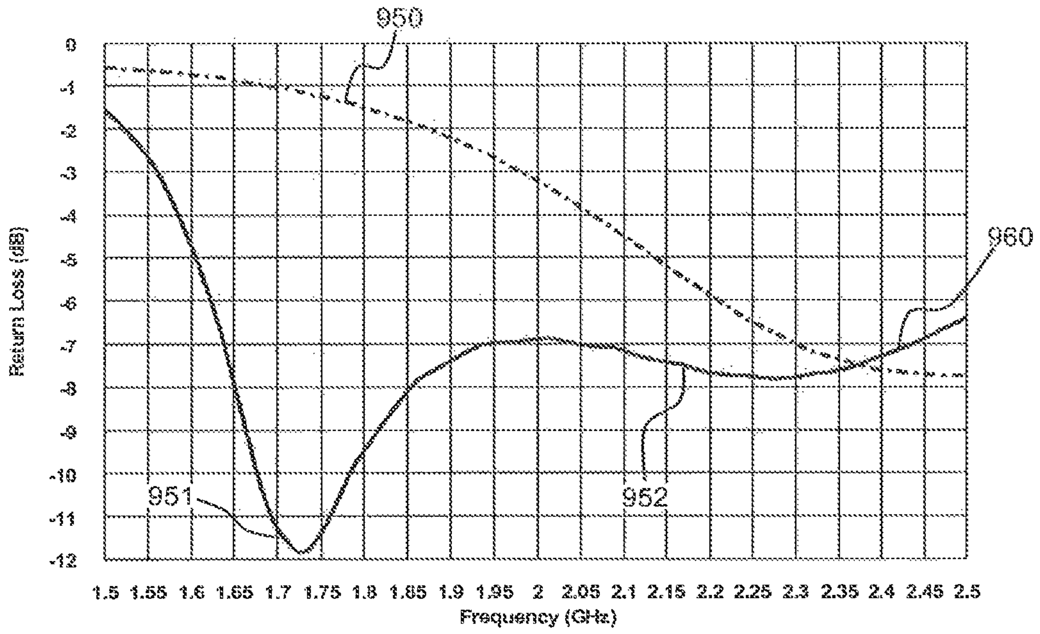

Likewise, in FIG. 9*b* curve 950 (in dash-dotted line) presents the typical input return loss of the radiating structure 400 observed at its second internal port when the radiofrequency system 500 is not connected to said second internal port. From said curve 950 it is clear that the radiating structure 400 is not matched in the second frequency region and that the second radiation booster 405 is non-resonant in said second frequency region. On the other hand, curve 960 (in solid line) corresponds to the input return losses at the second port of the second matching network 505 (when disconnected from the second band-pass filter 507).

The first and second matching networks 504, 505 of the radiofrequency system 500 transform the input impedance of the first and second internal ports of the radiating structure 400 to provide impedance matching respectively in the first and second frequency regions. Indeed, curve 910 exhibits return losses better than −6 dB in the first frequency region (delimited by points 901 and 902 on the curve 910), while curve 960 exhibits return losses better than −6 dB in the second frequency region (delimited by points 951 and 952 on the curve 960).

Figure 10:
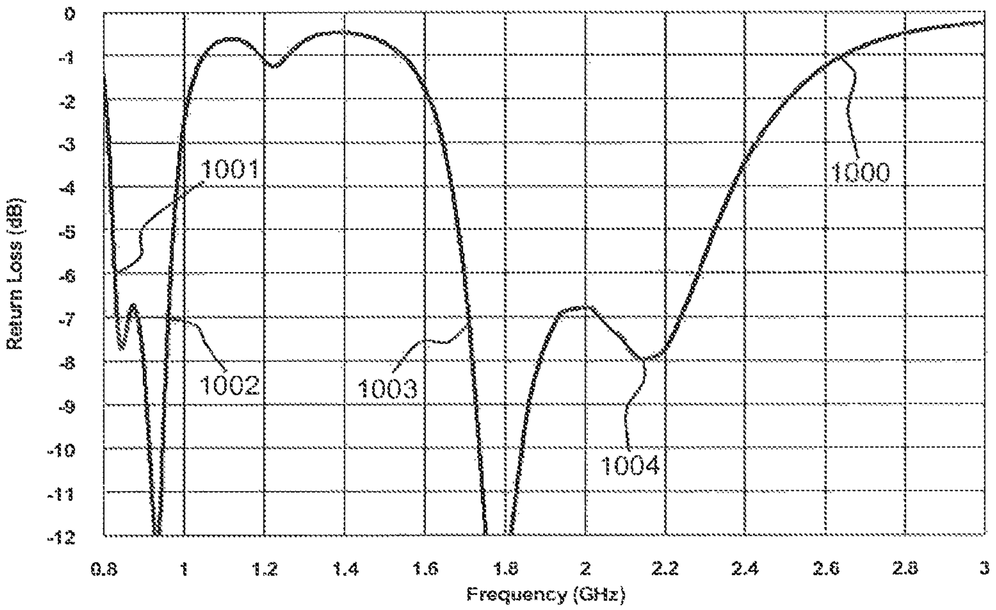
FIG. 10—Typical input return losses at the external port of the radiating system resulting from the interconnection of the radiating system of FIG. 5 to the radiating structure of FIGS. 4(*a*) and 4(*b*).

Finally, the frequency response of the radiating system resulting from the interconnection of the radiating system of FIG. 5 to the radiating structure of FIG. 4 is shown in FIG. 10, in which the curve 1000 corresponds to the return loss observed at the external port of the radiating system. The return loss curve 1000 exhibits a better than −6 dB behavior in the first frequency region (delimited by points 1001 and 1002 on said curve 1000) and in the second frequency region (delimited by points 1003 and 1004), making it possible for the radiating system to provide operability for the GSM850, GSM900, GSM1800, GSM1900 and UMTS standards.

Figure 18:
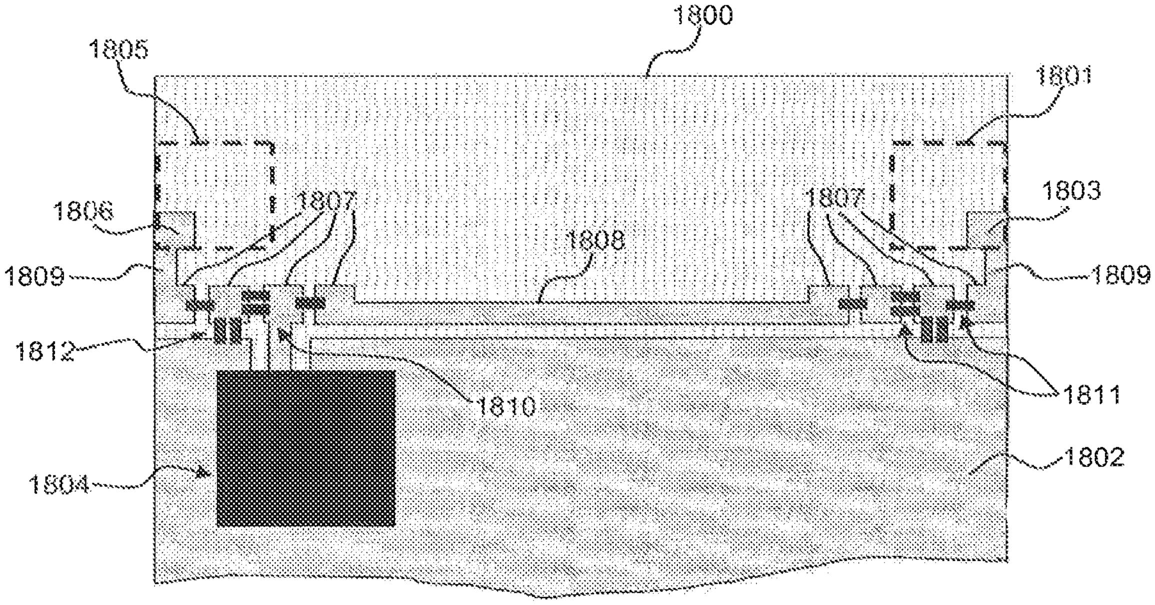
FIG. 18—Partial top plan view of a partially-populated PCB showing the layout of the ground plane layer of a radiating structure and the conducting traces and pads of a radiofrequency system.

The radiating structure of FIG. 4 and the radiofrequency system of FIG. 5 could be advantageously provided on a common layer of a PCB, as it is shown in FIG. 18, in which on a layer of a PCB 1800 it is provided a ground plane layer 1802 and the conducting traces and pads of the radiofrequency system that make it possible to interconnect a first and a second radiation booster to an external port 1810, which is connected to an integrated circuit chip 1804 performing radiofrequency functionality.

The first radiation booster 401 in FIG. 4 could be mounted on a first area 1801 of the PCB 1800 (delimited with a dash-dotted line) and the connection point 403 of the first radiation booster 401 be electrically connected (e.g., soldered) to a mounting pad 1803. Analogously, the second radiation booster 405 could be provided on a second area 1805 (also delimited with a dash-dotted line on the PCB 1800), and the connection point 406 of said second radiation booster 405 be electrically connected to a mounting pad 1806.

A plurality of pads 1807 is provided in order to mount the circuit components 1811, 1812 of the matching networks and band-pass filters of the radiofrequency system 500. The pads 1807 are laid out adjacent to an edge of the ground plane layer 1802 to facilitate mounting shunted circuit components 1812.

Furthermore, conducting traces 1808, 1809 allow routing the signals between the mounting pads 1803, 1806 and the external port 1810. In particular, conducting trace 1808 together with the ground plane layer 1802 defines a coplanar transmission line. In an example, said transmission line features a characteristic impedance of 50 Ohms. In another example, the conducting trace 1808 is designed so that said transmission line cooperates with a band-pass filter of the radiofrequency system to present high impedance to the external port 1810.

Referring now to FIG. 11, it is shown a partial perspective view of two examples of radiating structures for a radiating system of a wireless handheld or portable device comprising two radiation boosters.

Figure 11A:
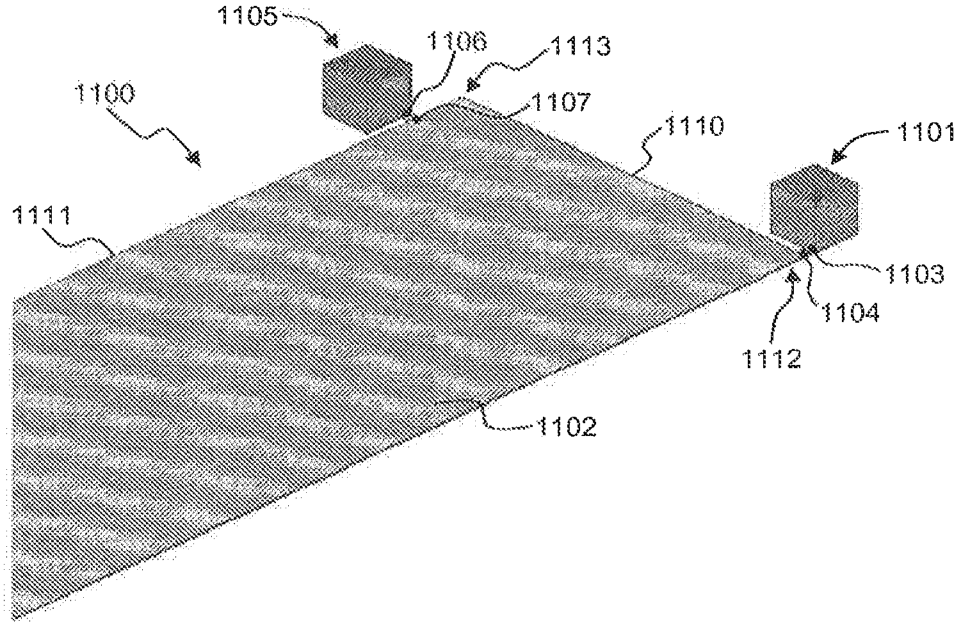
FIGS. 11(*a*) and 11(*b*)—Partial perspective views of first and second examples, respectively, of radiating structures comprising two radiation boosters according to the present invention.

In particular, FIG. 11*a* presents a radiating structure 1100 comprising a first radiation booster 1101, a second radiation booster 1105, and a ground plane layer 1102. The radiating structure 1100 comprises two internal ports: a first internal port being defined between a connection point of the first radiation booster 1103 and a first connection point of the ground plane layer 1104; and a second internal port being defined between a connection point of the second radiation booster 1106 and a second connection point of the ground plane layer 1107.

The ground plane layer 1102 features a substantially rectangular shape having a short edge 1110 and a long edge 1111. In this example, the first radiation booster 1101 is substantially close to a first corner of the ground plane layer 1112 and the second radiation booster is substantially close to a second corner of the ground plane layer 1113. Since the ground plane layer is substantially rectangular, the first and second corners 1112, 1113 are advantageously in common with two corners of the ground plane rectangle associated to said ground plane layer 1102. Moreover, said two corners 1112, 1113 are at opposite ends of the short edge of the ground plane layer 1110 (which coincides in this example with a short side of the ground plane rectangle).

In the radiation structure 1100, the first radiation booster 1101 is arranged substantially close to the short edge 1110, while the second radiation booster 1105 is arranged substantially close to the long edge 1111. The short edge 1110 and the long edge 1111 are advantageously perpendicular and meet at the corner 1113 of the ground plane layer 1102.

A radiating structure such as that in FIG. 11*a* may be particularly interesting when it is necessary to achieve higher isolation between the two internal ports of the radiating structure. The enhancement in isolation is due not only to the separation between the two radiation boosters (which is maximized along the short edge of the ground plane layer), but also to their relative orientation with respect to the edges of the ground plane layer (which may excite two radiation modes on the ground plane layer having substantially orthogonal polarizations).

Figure 11B:
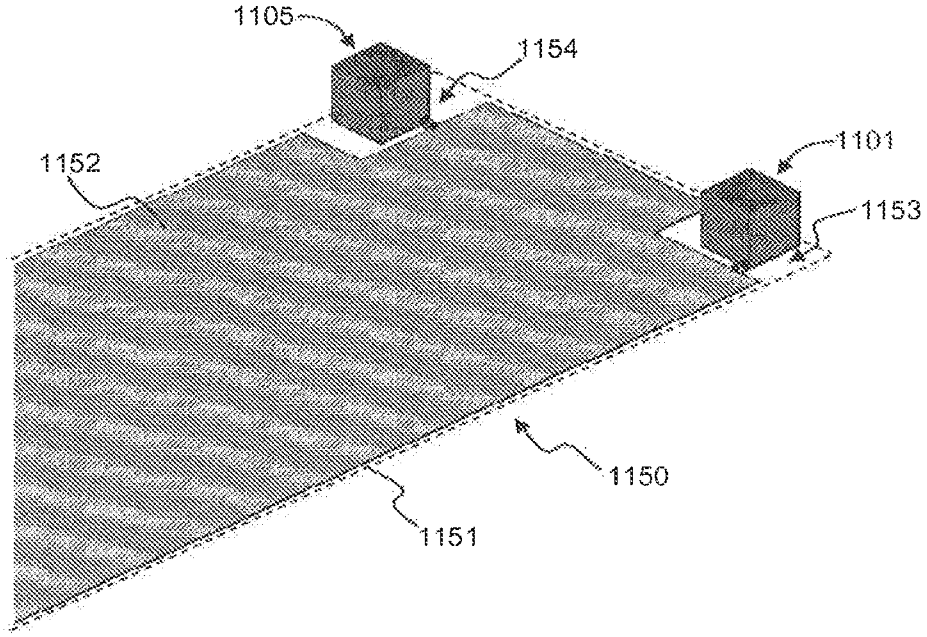

FIG. 11*b* shows a radiating structure 1150 similar to that of FIG. 11*a*, but in which its ground plane layer 1152 has been modified with respect to that in FIG. 11*a* to include two cut-out portions in which metal has been removed from the ground plane layer 1152. A first cut-out portion 1153 has been provided where the ground plane layer 1102 had its first corner 1112, while a second cut-out portion 1154 has been provided where the ground plane layer 1102 had its second corner 1113.

Despite the fact that the ground plane layer 1152 is irregularly shaped compared to the rectangular ground plane layer 1102), it has a ground plane rectangle 1151 equal to that associated to the ground plane layer 1102.

The first radiation booster 1101 can now be provided on the first cut-out portion 1153, while the second radiation booster 1105 can be provided on the second cut-out portion 1154. That is, with respect to the example in FIG. 11*a*, the radiation boosters 1101, 1105 have been receded towards the inside of the ground plane rectangle 1151, so that the orthogonal projection of the first and second radiation booster 1101, 1105 on the plane containing the ground plane layer 1152 is completely inside the perimeter of the ground plane rectangle 1151. Such a ground plane layer and arrangement of the radiation boosters with respect to the ground plane layer are advantageous to facilitate the integration of the radiating structure within a particular handheld or portable wireless device.

Figure 12:
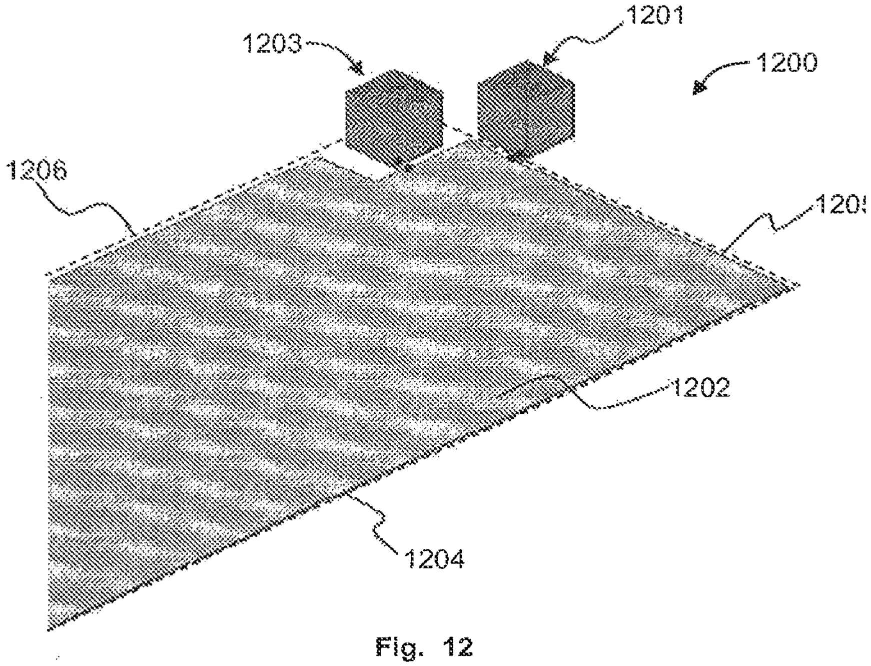
FIG. 12—Partial perspective view of another example of a radiating structure comprising two radiation boosters.

In FIG. 12, it is presented another example of a radiating structure for a radiating system according to the present invention. The radiating structure 1200 comprises two radiation boosters: a first radiation booster 1201 and a second ration booster 1203, each again comprising a conductive part. The radiating structure 1200 further comprises a ground plane layer 1202 (shown only partially in FIG. 12), inscribed in a ground plane rectangle 1204. The ground plane rectangle 1204 has a short side 1205 and a long side 1206.

The first radiation booster 1201 is arranged substantially close to said short side 1205, and the second radiation booster 1203 is arranged substantially close to said long side 1206. Moreover, the first and second radiation boosters 1201, 1203 are also substantially close to a first corner of the ground plane rectangle 1204, said corner being defined by the intersection of said short side 1205 and said long side 1206.

In this particular case, the first radiation booster 1201 protrudes beyond the short side 1205 of the ground plane rectangle 1204, so that the orthogonal projection of the first radiation booster 1201 on the plane containing the ground plane layer 1202 is outside the ground plane rectangle 1204. On the other hand, the second radiation booster 1203 is arranged on a cut-out portion of the ground plane layer 1202, so that the orthogonal projection of the second radiation booster 1203 on said plane containing the ground plane layer 1202 does not overlap the ground plane layer. Moreover, said projection is completely inside the perimeter of the ground plane rectangle 1204.

However, in another example both the first and the second radiation boosters could have been arranged on cut-out portions of the ground plane layer, so that the radiation boosters are at least partially, or even completely, inside the perimeter of the ground plane rectangle associated to the ground plane layer of a radiating structure. And yet in another example, both the first and the second radiation boosters could have been arranged at least partially, or even completely, protruding beyond a side of said ground plane rectangle.

The radiating structure 1200 may be advantageous to facilitate the interconnection of the radiation boosters 1201, 1203 to a radiofrequency system, since the connection points of said radiation boosters (not indicated in FIG. 12) are much closer to each other, that they are for example in the radiating structures of FIG. 11.

Figure 13:
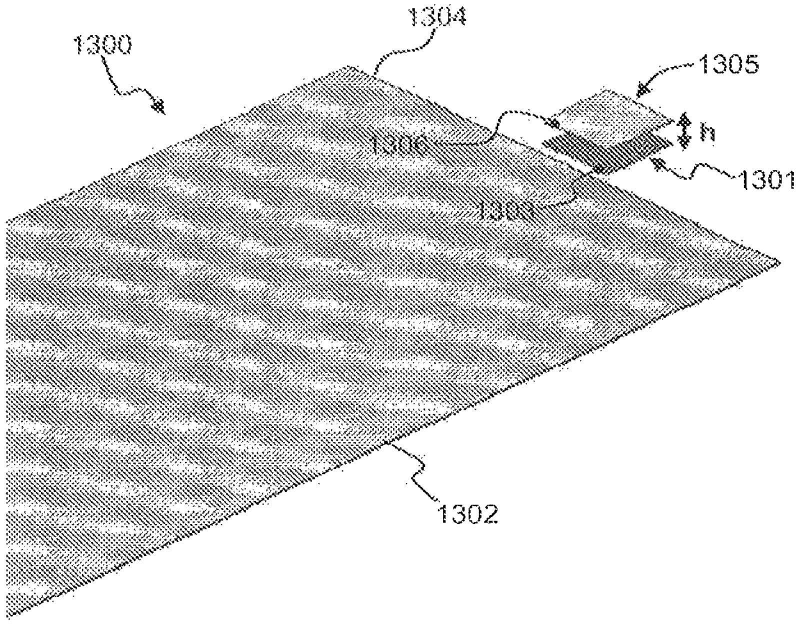
FIG. 13—Partial perspective view of a radiating structure comprising two radiation boosters arranged one on top of another in a stacked configuration.

FIG. 13 presents another example of a radiating structure comprising two radiation boosters, in which one radiation booster is arranged one on top of the other radiation booster forming a stacked configuration.

The radiating structure 1300 comprises a first and a second radiation booster 1301, 1305 and a ground plane layer 1302. The first radiation booster 1301 comprises a substantially planar conducting put having a polygonal shape (in this example a square shape) and a first connection point 1303 located substantially on the perimeter of said conducting part. The second radiation booster 1305 also comprises a substantially planar conducting part having a polygonal shape and a second connection point 1306 located substantially on the perimeter of said conducting part. Said first and second connection points 1303, 1306 define together with a connection point of the ground plane layer 1302 (not shown in the figure) a first and a second internal port of the radiating structure 1300.

In the example of the figure, the shape and dimensions of the two radiation boosters 1301, 1305 are substantially the same, although in other examples the boosters may have different shapes and/or sizes, although preferably they will be substantially planar.

The first radiation booster 1301 is substantially coplanar to the ground plane layer 1302 of the radiating structure 1300, and is arranged with respect to said ground plane layer 1302 such that the first radiation booster 1301 is substantially close to a short edge 1304 of the ground plane layer 1302 and protrudes beyond said short edge 1304.

The second radiation booster 1305 is advantageously located at a certain height h above the first radiation booster 1301, such that the orthogonal projection of the second radiation booster 1305 on the plane containing the ground plane layer 1302 overlaps a substantial portion of the orthogonal projection of the first radiation booster 1301 on said plane. A substantial portion may preferably refer to at least 50%, 60%, 75% or 90% of the area of the orthogonal projection of the first radiation booster 1301. In the example of the figure, the portion overlapped corresponds to 100% of the area of the orthogonal projection of the first radiation booster 1301. This overlapping between the radiation boosters of a radiating structure is advantageous for achieving a very compact arrangement.

Furthermore, in order to facilitate the integration of the first and second boosters 1301, 1305, the height h is preferably not larger than a 2% of the free-space wavelength corresponding to the lowest frequency of the first frequency region of operation of the radiating system comprising the radiating structure 1300. In this example, said height h is about 5 mm, although in other examples it could be even smaller.

Figure 14A:
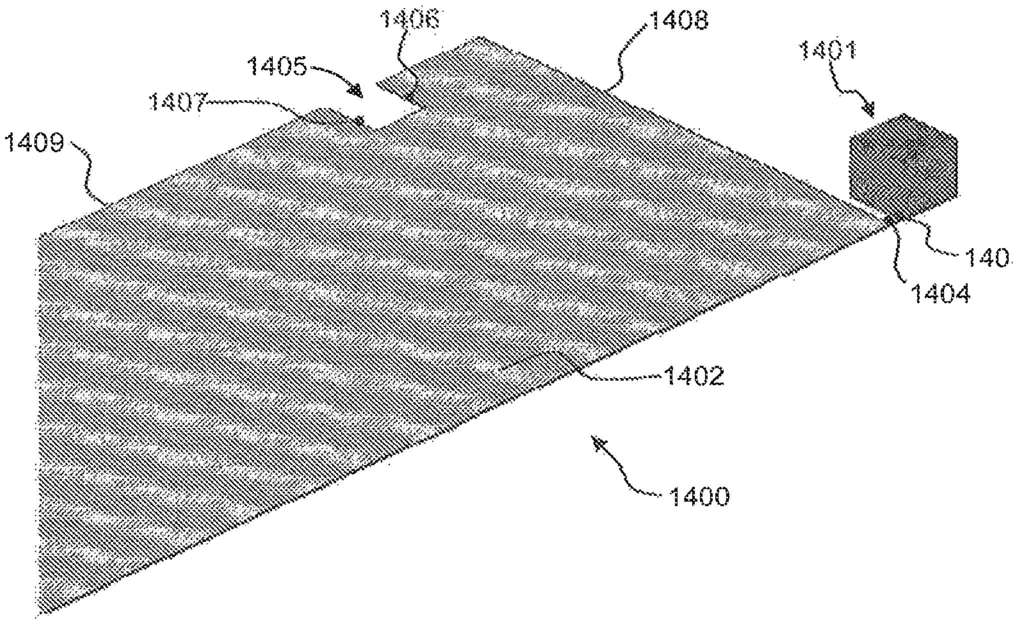
FIGS. 14(*a*)-14(*c*)—Partial perspective views of first, second and third examples, respectively, of radiating structures for a radiating system, each radiating structure including a first radiation booster comprising a conductive part and a second radiation booster comprising a gap defined in a ground plane layer.

FIG. 14 provides three examples of radiating structures for a radiating system capable of operating in a first and in a second frequency region according to the present invention that combine a radiation booster comprising a conductive part with another radiation booster comprising a gap defined in the ground plane layer of the radiating structure. In particular, in FIG. 14*a* a radiating structure 1400 comprises a first radiation booster 1401 and a second radiation booster 1405. Both radiation boosters 1401, 1405 cooperate with a ground plane layer 1402 (shown partially in the figure).

The first radiation booster 1401 comprises a conducting part and is similar to the radiation boosters already described in connection with the example of FIG. 4. That is, the conductive part of the first radiation booster 1401 features a polyhedral shape comprising six faces. Moreover, since in this case said six faces are substantially square, said conductive part is a cube. Said first booster comprises a connection point 1403 that defines together with a first connection point of the ground plane layer 1404 a first internal port of the radiating structure.

The second radiation booster 1405 comprises a gap defined in the ground plane layer 1402. Said gap is delimited by a plurality of segments (more precisely, 3 segments in the examples shown in FIG. 14) defining a curve, which in this case is open as the curve intersects the perimeter of the ground plane layer 1402 (in particular a long edge 1409 of said ground plane layer 1402). Furthermore, the gap of the second radiation booster 1405 features a polygonal shape, which in this example is substantially square. This second radiation booster 1405 comprises a connection point 1406 located at a first point along said curve. A second connection point of the ground plane layer 1407 is located at a second point along said curve, said second point being different from said first point. A second internal port of the radiating structure 1400 is defined between the connection point 1406 and the second connection point of the ground plane layer 1407.

In FIG. 14*a*, the first radiation booster 1401 is arranged with respect to the ground plane layer 1402 so that the upper and bottom faces of the first radiation booster 1401 are substantially parallel to the ground plane layer 1402. Moreover, the bottom face of the first radiation booster 1401 is advantageously coplanar to the ground plane layer 1402. Thus, the first radiation booster 1401 is substantially coplanar to the second radiation booster 1405.

In the radiating structure 1400, the first radiation booster 1401 protrudes beyond a short edge 1408 of the ground plane layer 1402, and is located substantially close to said short edge 1408, and more precisely substantially close to an end of said short edge 1408. The second radiation booster 1405 is located substantially close to a long edge 1409 of the ground plane layer 1402, said long edge 1409 being substantially perpendicular to said short edge 1408. More specifically, the second radiation booster 1405 is located near an end of the long edge 1409, said end being in common with an end of the short side 1408.

In accordance with an aspect of the present invention, a maximum size of each of the first and second radiation boosters 1401, 1405 is advantageously smaller than 1/30 times the free-space wavelength corresponding to the lowest frequency of the first frequency region of operation of the radiating structure 1400. Furthermore in this example, at least the first radiation booster 1401 has a maximum size smaller than 1/30 times the free-space wavelength corresponding to the lowest frequency of the second frequency region of operation of the radiating structure 1400.

The very small dimensions of the first and second radiation boosters 1401, 1405 result in the radiating structure 1400 having at each of the first and second internal ports a first resonance frequency at a frequency much higher than the frequencies of the first frequency region. According to the present invention, the ratio between the first resonance frequency of the radiating structure 1400 measured at each of the first and second internal ports (in absence of a radiofrequency system connected to them) and the highest frequency of the first frequency region is advantageously larger than 3.5. Said first resonance frequency at each of the first and second internal ports of the radiating structure 1400 is also at a frequency much higher than the frequencies of the second frequency region.

With such small first and second radiation boosters 1401, 1405, the input impedance of the radiating structure 1400 measured at the first internal port features an important capacitive component within the frequencies of the first and second frequency regions, and the second internal port features an important inductive component within the frequencies of the first and second frequency regions.

Figure 14B:
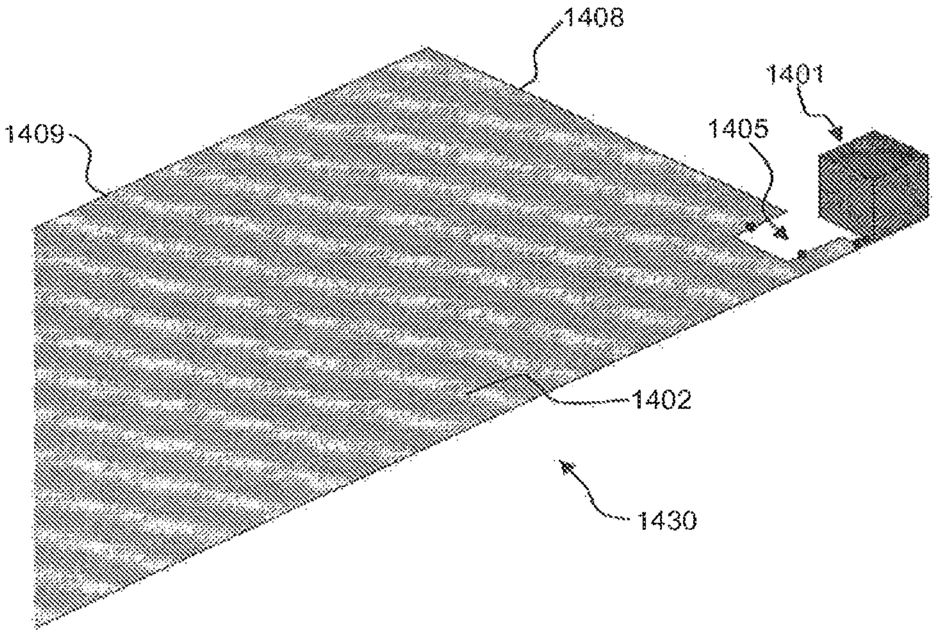

The radiating structure 1430 shown in FIG. 14*b* is a modification of the radiating structure 1400 of FIG. 14*a*, in which the arrangement of the first and second radiation boosters 1401, 1405 with respect to the ground plane layer 1402 is different.

In particular, the second radiation booster 1405 has been translated and rotated with respect to the case shown in FIG. 14*a*. The second radiation booster 1405 is now located substantially close to the short edge 1408 of the ground plane layer 1402, and more precisely substantially close to an end of said short edge 1408. Given that the first radiation booster 1401 is also located substantially close to said end of the short edge 1408, the first and second radiation boosters 1401, 1405 are arranged near a same corner of the ground plane layer 1402, which facilitates the interconnection of the radiation boosters with a radiofrequency system.

Furthermore, the second radiation booster 1405 has undergone a 90 degree clockwise rotation, so that the curve delimiting the gap of said second radiation booster 1405 intersects now the short edge 1408 of the ground plane layer 1402. Such an orientation makes it possible for the second radiation booster 1405 to excite a radiation mode on the ground plane layer 1402 having a polarization substantially orthogonal to the polarization of the radiation mode excited on the ground plane layer 1402 by the first radiation booster 1401.

Figure 14C:
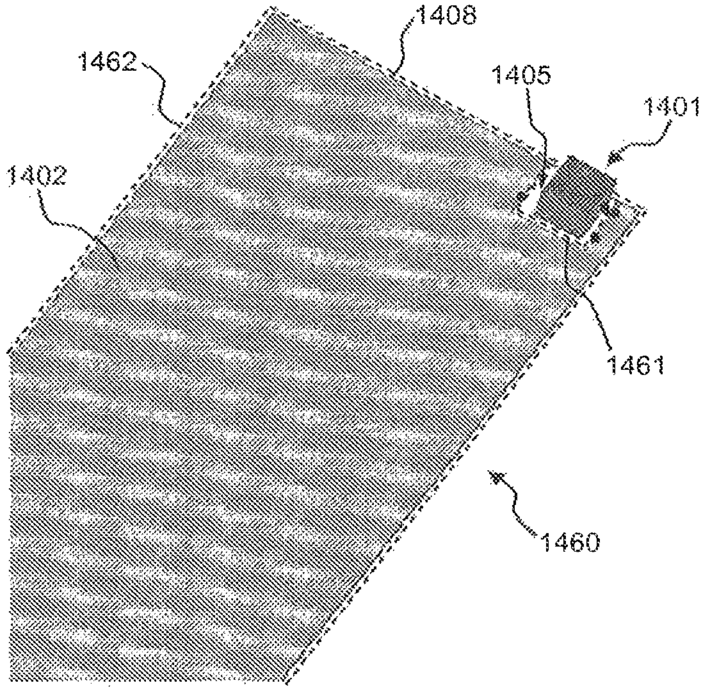

Referring now to FIG. 14*c*, it is shown another example of a radiating structure that constitutes a further modification of the two previous ones. More specifically, the position of the first radiation booster 1401 has been modified with respect to the position it had in the case of FIG. 14*b*, so that the first radiation booster 1401 has a projection on the plane containing the ground plane layer 1402 that is completely within the projection of the second radiation booster 1405 on said same plane. Moreover, the orthogonal projection of the first and second radiation boosters 1401, 1405 on said plane containing the ground plane layer 1402 is completely inside the perimeter of the ground plane rectangle 1462 associated to the ground plane layer 1402. Such an arrangement leads to very compact solutions.

The first radiation booster 1401 is advantageously embedded within the second radiation booster 1405, because at least a part of a first booster box associated to the first radiation booster 1401 is contained within a second booster box 1461 associated to the second radiation booster 1405. In this particular example, the first booster box coincides with the external area of the first radiation booster 1401, while the second booster box 1461 is a two-dimensional entity defined around the gap of the second radiation booster 1405. The bottom face of the first booster box is thus contained within the second booster box 1461.

Figure 15:
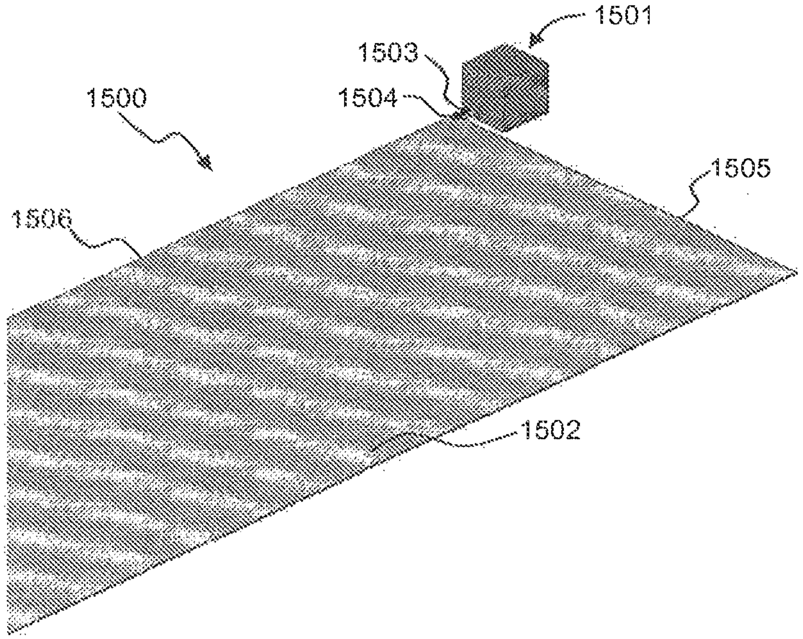
FIG. 15—Example of a radiating structure for a radiating system according to the present invention, the radiating structure including only one radiation booster.

FIG. 15 shows another radiating structure 1500 for a radiating system capable of operating in a first and in a second frequency region of the electromagnetic spectrum when an appropriate radiofrequency system is connected to said radiating structure 1500.

As in the previous examples, the radiation structure 1500 comprises a substantially rectangular ground plane layer 1502 and a first radiation booster 1501. However, there is no second radiation booster. That is, the radiating structure 1500 has only one radiation booster.

The first radiation booster 1501 protrudes beyond the ground plane layer 1502 (i.e., there is no ground plane in the orthogonal projection of the radiation booster 1501 onto the plane containing the ground plane layer 1502). Moreover, said first radiation booster 1501 is advantageously located substantially close to a corner of the ground plane layer 1502, said corner being defined by the intersection of a short edge 1505 and a long edge 1506 of the ground plane layer 1502.

The first radiation booster 1501 comprises a connection point 1503, which defines together with a connection point of the ground plane layer 1504 an internal port of the radiating structure 1500.

In this example, the first radiation booster 1501 (i.e., a same radiation booster) in cooperation with a radiofrequency system advantageously excites at least two different radiation modes on the ground plane layer 1502 responsible for the operation of the resulting radiating system in said first and second frequency regions of the electromagnetic spectrum.

Figure 16:
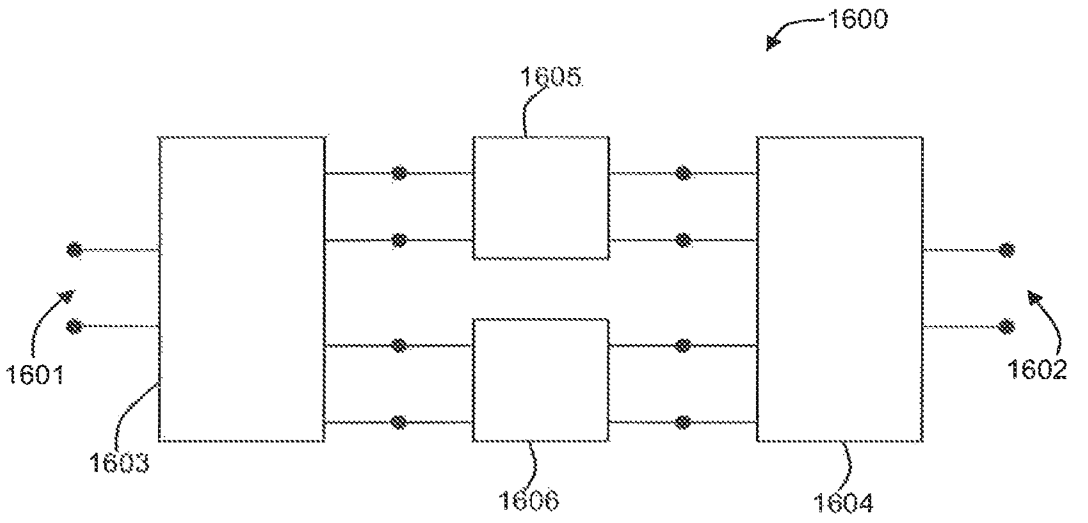
FIG. 16—Schematic representation of a radiofrequency system for a radiating system whose radiating structure is shown in FIG. 15.
Figure 17:
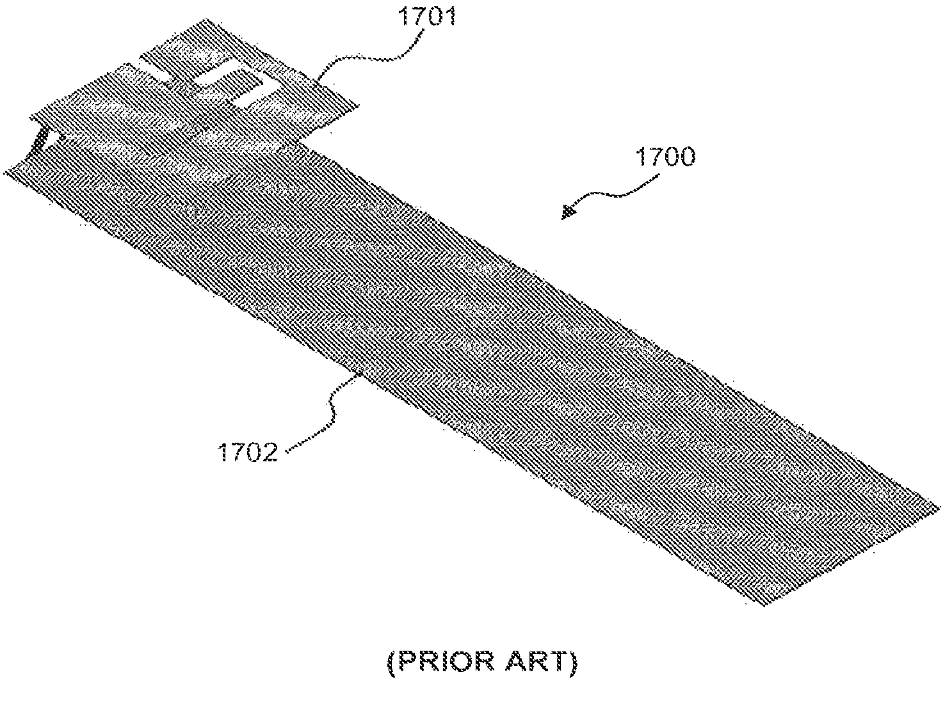
(PRIOR ART) Fig. 17
FIG. 17—Radiating structure of a typical wireless handheld or portable device.

FIG. 16 shows an example of a radiofrequency system suitable for interconnection with the radiating structure of FIG. 15, The radiofrequency system 1600 comprises a first diplexer 1603 to separate the electrical signals of a first and a second frequency regions of operation of a radiating system, a first matching network 1605 to provide impedance matching in said first frequency region, a second matching network 1606 to provide impedance matching in said second frequency region, and a second diplexer 1604 to recombine the electrical signals of said first and second frequency regions.

Each of the first and second matching networks 1605, 1606 may be as in any of the examples of matching networks described in connection with FIG. 3.

The first diplexer 1603 is connected to a first port 1601, while the second diplexer 1604 is connected to a second port 1602. In a radiating system, an internal port of a radiating structure (such as for instance the internal port of the radiating structure 1500) may be connected to said first port 1601, while an external port of the radiating system may be connected to said second port 1602.

The use of diplexers in the radiofrequency system is advantageous to separate the electrical signals of different frequency regions and transform the input impedance characteristics in each frequency region independently from the others.

Even though that in the illustrative examples described above in connection with the figures some particular designs of radiation boosters have been used, many other designs of radiation boosters having for example different shape and/or dimensions could have been equally used in the radiating structures.

In that sense, although the first and second radiation boosters in FIGS. 4, 11, and 12, and the first radiation booster in FIGS. 14 and 15, have a volumetric geometry, other designs of substantially planar radiation boosters could have been used instead.

Also, even though that some examples of radiating structures (such as for instance, but not limited to, those in FIG. 4, 11, 12 or 15) have been described as comprising radiation boosters having a conductive part, other possible examples could have been constructed using radiation boosters comprising a gap defined in the ground plane layer of the radiating structure.

In the same way, despite the fact that the first and second radiation boosters in FIGS. 4 and 11-13 have been chosen to be equal in topology (i.e., a planar versus a volumetric geometry), shape and size, they could have been selected to have different topology, shape and/or size, while preserving for example the relative location of the radiation boosters with respect to each other and with respect to the ground plane layer.

What is claimed is:

1. A radiation booster system for a radiating structure of a radiating system, comprising:

a first radiation booster including a first connection point coupled to a first connection point of a ground plane layer of the radiating system via a first internal port, the first radiation booster coupling electromagnetic energy to and from the ground plane layer; and a second radiation booster including a second connection point coupled to a second connection point of the ground plane layer via a second internal port, the second radiation booster coupling electromagnetic energy to and from the ground plane layer;

wherein the radiating system further comprises a radiofrequency system and at least two external ports, and wherein at least one of the first and second radiation boosters has a maximum dimension smaller than 1/30 times the free-space wavelength corresponding to a lowest frequency of operation of the radiating system.

2. The radiation booster system of claim 1, wherein the first and second radiation boosters have a maximum dimension smaller than 1/30 times the free-space wavelength corresponding to the lowest frequency of operation.

3. The radiation booster system of claim 1, wherein an orthogonal projection of at least one of the first and second radiation boosters onto a plane of the ground plane layer overlaps the ground plane layer.

4. The radiation booster system of claim 3, wherein an orthogonal projection of at least one of the first and second radiation boosters onto a plane of the ground plane layer completely overlaps the ground plane layer.

5. The radiation booster system of claim 3, wherein an orthogonal projection of at least one of the first and second radiation boosters onto a plane of the ground plane layer partially overlaps the ground plane layer.

6. The radiation booster system of claim 3, wherein at least a portion of the ground plane layer is removed from the orthogonal projection that overlaps the ground plane layer.

7. The radiation booster system of claim 1, wherein the first radiation booster comprises a gap delimited by one or more segments defining a curve, and wherein the first connection point of the first radiation booster is located at a first point along the curve and wherein the first connection point of the ground plane layer is located at a second point along the curve, the second point being different from the first point.

8. The radiation booster system of claim 1, wherein the first radiation booster comprises a conductive part and the second radiation booster comprises a gap defined in the ground plane layer.

9. The radiation booster system of claim 1, wherein the first radiation booster comprises a first conductive part and the second radiation booster comprises a second conductive part.

10. The radiation booster system of claim 1, wherein the first radiation booster is located close to an edge of the ground plane layer, the edge being in common with a side of a ground plane rectangle defined as the minimum-sized rectangle that encompasses the ground plane layer.

11. The radiation booster system of claim 10, wherein at least one of the first and second radiation boosters is located close to an end of the ground plane layer edge.

12. The radiation booster system of claim 10, wherein at least one of the first and second radiation boosters is located close to a middle point of the edge of the ground plane layer.

13. The radiation booster system of claim 1, wherein the first and second radiation boosters are arranged one on top of the other.

14. A radiation booster system for a radiating structure of a radiating system, comprising:

a first radiation booster including a first connection point coupled to a first connection point of a ground plane layer of the radiating system via a first internal port, the first radiation booster coupling electromagnetic energy to and from the ground plane layer; and a second radiation booster including a second connection point coupled to a second connection point of the ground plane layer via a second internal port, the second radiation booster coupling electromagnetic energy to and from the ground plane layer;

wherein the radiating system further comprises a radiofrequency system and at least two external ports, and wherein the first radiation booster has an orthogonal projection on a plane of the ground plane layer that is completely within an orthogonal projection of the second radiation booster on the plane of the ground plane layer.

15. The radiation booster system of claim 14, wherein the orthogonal projection of the first and second radiation boosters on the plane of the ground plane layer is completely inside the perimeter of a ground plane rectangle defined as the minimum-sized rectangle that encompasses the ground plane layer.

16. The radiation booster system of claim 14, wherein the first radiation booster comprises a gap in the ground plane layer, the gap delimited by one or more segments defining a curve, and wherein the first connection point of the first radiation booster is located at a first point along the curve and wherein the first connection point of the ground plane layer is located at a second point along the curve, the second point being different from the first point.

17. The radiation booster system of claim 14, wherein the first radiation booster is configured for operating at a first frequency region and the second radiation booster is configured for operation at a second frequency region different from the first frequency region.

* * * * *